(12) United States Patent
Murugan et al.

(10) Patent No.: US 12,444,702 B2
(45) Date of Patent: Oct. 14, 2025

(54) FLIP-CHIP ENHANCED QUAD FLAT NO-LEAD ELECTRONIC DEVICE WITH CONDUCTOR BACKED COPLANAR WAVEGUIDE TRANSMISSION LINE FEED IN MULTILEVEL PACKAGE SUBSTRATE

(71) Applicant: Texas Instruments Incorporated, Dallas, TX (US)

(72) Inventors: Rajen Manicon Murugan, Dallas, TX (US); Yiqi Tang, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 628 days.

(21) Appl. No.: 17/747,740

(22) Filed: May 18, 2022

(65) Prior Publication Data

US 2023/0044284 A1     Feb. 9, 2023

Related U.S. Application Data

(60) Provisional application No. 63/228,566, filed on Aug. 2, 2021.

(51) Int. Cl.
    *H01Q 9/28*        (2006.01)
    *H01L 23/00*     (2006.01)
    (Continued)

(52) U.S. Cl.
    CPC ........ *H01L 23/66* (2013.01); *H01L 23/49805* (2013.01); *H01L 23/49822* (2013.01);
    (Continued)

(58) Field of Classification Search
    CPC ........... H01Q 1/38; H01Q 1/48; H01Q 1/422; H01Q 1/526; H01Q 1/2283; H01Q 9/28;
    (Continued)

(56) References Cited

U.S. PATENT DOCUMENTS

| | | |
|---|---|---|
| 3,388,339 A | 6/1968 | Malnar et al. |
| 8,217,724 B2 | 7/2012 | Briggs et al. |
| (Continued) | | |

OTHER PUBLICATIONS

Y. Zhang and J. Mao, "An Overview of the Development of Antenna-in-Package Technology for Highly Integrated Wireless Devices," in Proceedings of the IEEE, vol. 107, No. 11, pp. 2265-2280, Nov. 2019, doi: 10.1109/JPROC.2019.2933267.

(Continued)

*Primary Examiner* — Tung X Le
(74) *Attorney, Agent, or Firm* — Ronald O. Neerings; Frank D. Cimino

(57) ABSTRACT

An electronic device includes a multilevel package substrate with first, second, third, and fourth levels, a semiconductor die mounted to the first level, and a conductor backed coplanar waveguide transmission line feed with an interconnect and a conductor, the interconnect including coplanar first, second, and third conductive lines extending in the first level along a first direction from respective ends to an antenna, the second and third conductive lines spaced apart from opposite sides of the first conductive line along an orthogonal second direction, and the conductor extending in the third level under the interconnect and under the antenna.

16 Claims, 38 Drawing Sheets

(51) Int. Cl.
*H01L 23/498* (2006.01)
*H01L 23/66* (2006.01)

(52) U.S. Cl.
CPC ........ *H01L 23/49838* (2013.01); *H01L 24/08* (2013.01); *H01L 24/09* (2013.01); *H01L 24/16* (2013.01); *H01L 2223/6633* (2013.01); *H01L 2223/6677* (2013.01); *H01L 2223/6688* (2013.01); *H01L 2224/0801* (2013.01); *H01L 2224/0913* (2013.01); *H01L 2224/1601* (2013.01); *H01L 2224/16235* (2013.01); *H01L 2924/1421* (2013.01); *H01L 2924/182* (2013.01)

(58) Field of Classification Search
CPC .... H01Q 9/285; H01Q 9/0407; H01Q 13/106; H01L 23/66; H01L 23/3107; H01L 23/3121; H01L 23/49805; H01L 23/49822; H01L 23/49838
See application file for complete search history.

(56) References Cited

U.S. PATENT DOCUMENTS

| | | | |
|---|---|---|---|
| 8,624,682 B2 | 1/2014 | Ridley et al. | |
| 8,680,854 B2 | 3/2014 | Dyer et al. | |
| 8,836,327 B2 | 9/2014 | French et al. | |
| 8,906,470 B2 | 12/2014 | Overstolz et al. | |
| 9,201,404 B2 | 12/2015 | Harasaka et al. | |
| 9,529,334 B2 | 12/2016 | Herbsommer et al. | |
| 11,348,886 B2 * | 5/2022 | Wang | H01L 23/5389 |
| 11,837,775 B2 * | 12/2023 | Tang | H05K 1/0237 |
| 2005/0007118 A1 | 1/2005 | Kitching et al. | |
| 2005/0271250 A1 | 12/2005 | Vallone et al. | |
| 2006/0022761 A1 | 2/2006 | Abeles et al. | |
| 2007/0247241 A1 | 10/2007 | Bruan et al. | |
| 2010/0156547 A1 | 6/2010 | McGuyer et al. | |
| 2010/0189605 A1 | 7/2010 | Schmid et al. | |
| 2010/0193935 A1 * | 8/2010 | Lachner | H01Q 9/0457 |
| | | | 257/693 |
| 2011/0128082 A1 | 6/2011 | Maki et al. | |
| 2011/0147367 A1 | 6/2011 | Borwick, III et al. | |
| 2013/0015850 A1 | 1/2013 | Lindorfer et al. | |
| 2013/0021208 A1 | 1/2013 | Seok et al. | |
| 2013/0026586 A1 | 1/2013 | Seok et al. | |
| 2013/0044921 A1 | 2/2013 | In et al. | |
| 2013/0059551 A1 | 3/2013 | Ginsburg et al. | |
| 2013/0147472 A1 | 6/2013 | French et al. | |
| 2013/0176703 A1 | 7/2013 | Hopper et al. | |
| 2013/0299967 A1 | 11/2013 | Daniels et al. | |
| 2014/0285289 A1 | 9/2014 | Herbsommer et al. | |
| 2014/0287701 A1 | 9/2014 | Herbsommer et al. | |
| 2014/0287703 A1 | 9/2014 | Herbsommer et al. | |
| 2014/0347074 A1 | 11/2014 | Nadeau | |
| 2014/0368377 A1 | 12/2014 | Nadeau et al. | |
| 2014/0373599 A1 | 12/2014 | Trombley et al. | |
| 2015/0001694 A1 | 1/2015 | Hopper et al. | |
| 2015/0027908 A1 | 1/2015 | Parsa et al. | |
| 2015/0028866 A1 | 1/2015 | Parsa et al. | |
| 2015/0084707 A1 | 3/2015 | Maki | |
| 2015/0244382 A1 | 8/2015 | Ishihara | |
| 2015/0277386 A1 | 10/2015 | Passilly et al. | |
| 2015/0280320 A1 | 10/2015 | Haroun et al. | |
| 2015/0295305 A1 | 10/2015 | Herbsommer et al. | |
| 2016/0276731 A1 | 9/2016 | Seok et al. | |
| 2017/0093010 A1 | 3/2017 | Herbsommer et al. | |
| 2018/0156875 A1 | 6/2018 | Herbsommer et al. | |
| 2019/0013288 A1 | 1/2019 | Kim et al. | |
| 2019/0103653 A1 * | 4/2019 | Jeong | H01L 23/645 |
| 2019/0115643 A1 * | 4/2019 | Khan | H01Q 9/42 |
| 2019/0152773 A1 | 5/2019 | Herbsommer et al. | |
| 2019/0334220 A1 | 10/2019 | Ali et al. | |
| 2019/0346814 A1 | 11/2019 | Fruehling et al. | |
| 2020/0118949 A1 | 4/2020 | Moallem et al. | |
| 2020/0194871 A1 | 6/2020 | Moallem et al. | |
| 2020/0212536 A1 | 7/2020 | Gupta et al. | |
| 2020/0241480 A1 | 7/2020 | Bahr et al. | |
| 2020/0259239 A1 | 8/2020 | Moallem et al. | |
| 2020/0259240 A1 | 8/2020 | Moallem | |
| 2020/0403299 A1 | 12/2020 | Gupta et al. | |
| 2021/0050652 A1 | 2/2021 | Moallem et al. | |
| 2021/0075081 A1 * | 3/2021 | Kamphuis | H01L 24/48 |
| 2022/0376378 A1 * | 11/2022 | Tang | H01Q 19/10 |

OTHER PUBLICATIONS

F. Ahmed, M. Furqan and A. Stelzer, "120-GHz and 240-GHz Broadband Bow-Tie Antennas in eWLB Package for High Resolution Radar Applications," 2018 48th European Microwave Conference (EuMC), 2018, pp. 1109-1112, doi: 10.23919/EuMC.2018.8541732.

S. Beer and T. Zwick, "122 GHz antenna-integration in a plastic package based on a flip chip interconnect," 2011 IEEE MTT-S International Microwave Workshop Series on Millimeter Wave Integration Technologies, 2011, pp. 37-40, doi: 10.1109/IMWS3.2011.6061881.

C. Wang et al., "InFO_AiP Technology for High Performance and Compact 5G Millimeter Wave System Integration," 2018 IEEE 68th Electronic Components and Technology Conference (ECTC), 2018, pp. 202-207, doi: 10.1109/ECTC.2018.00039.

A. O. Watanabe et al., "3D Glass-Based Panel-Level Package with Antenna and Low-Loss Interconnects for Millimeter-Wave 5G Applications," 2019 IEEE MTT-S International Microwave Conference on Hardware and Systems for 5G and Beyond (IMC-5G), 2019, pp. 1-3, doi: 10.1109/IMC-5G47857.2019.9160350.

* cited by examiner

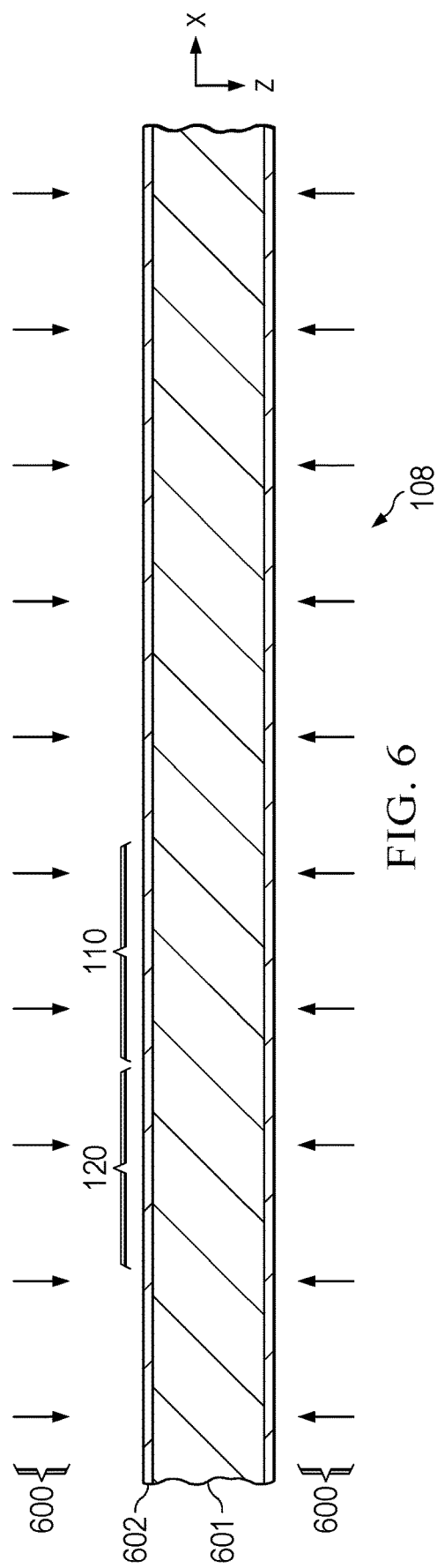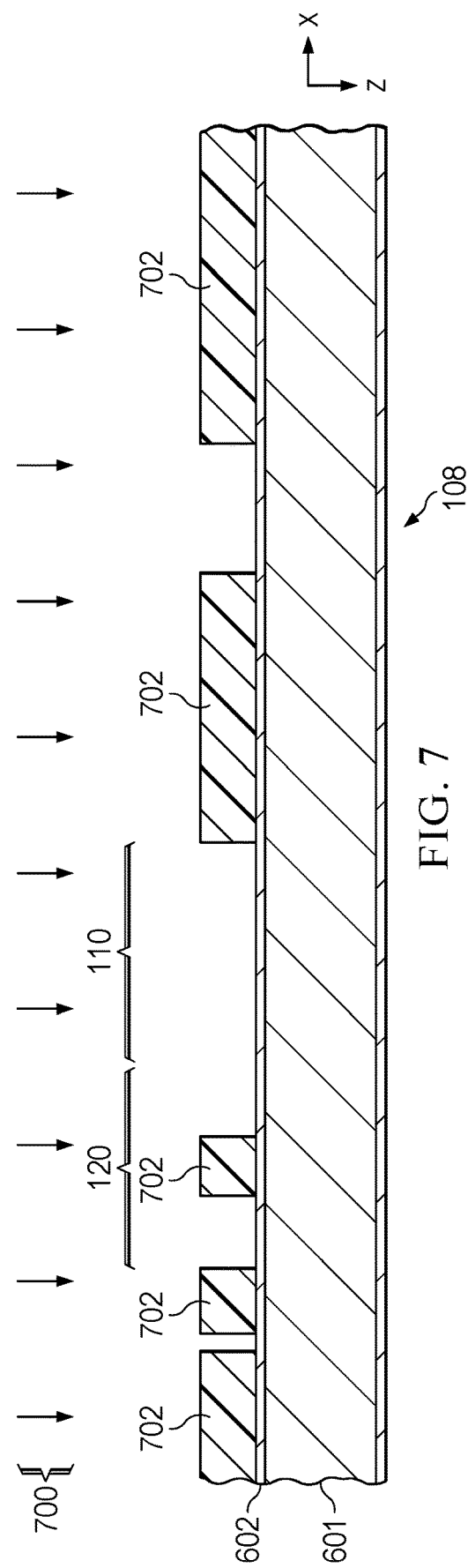

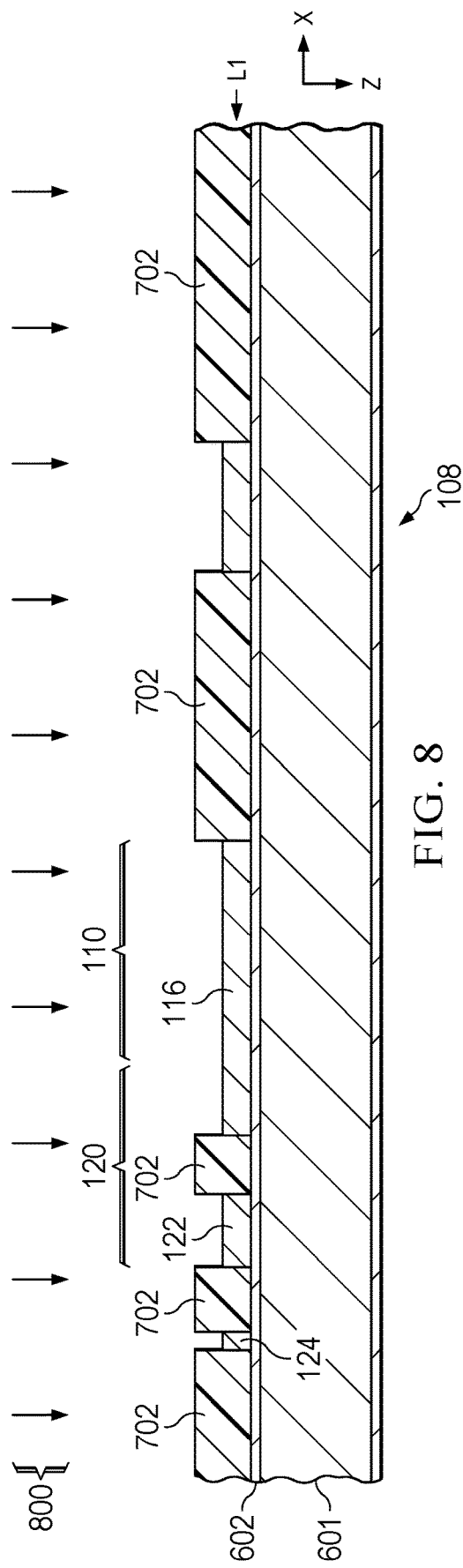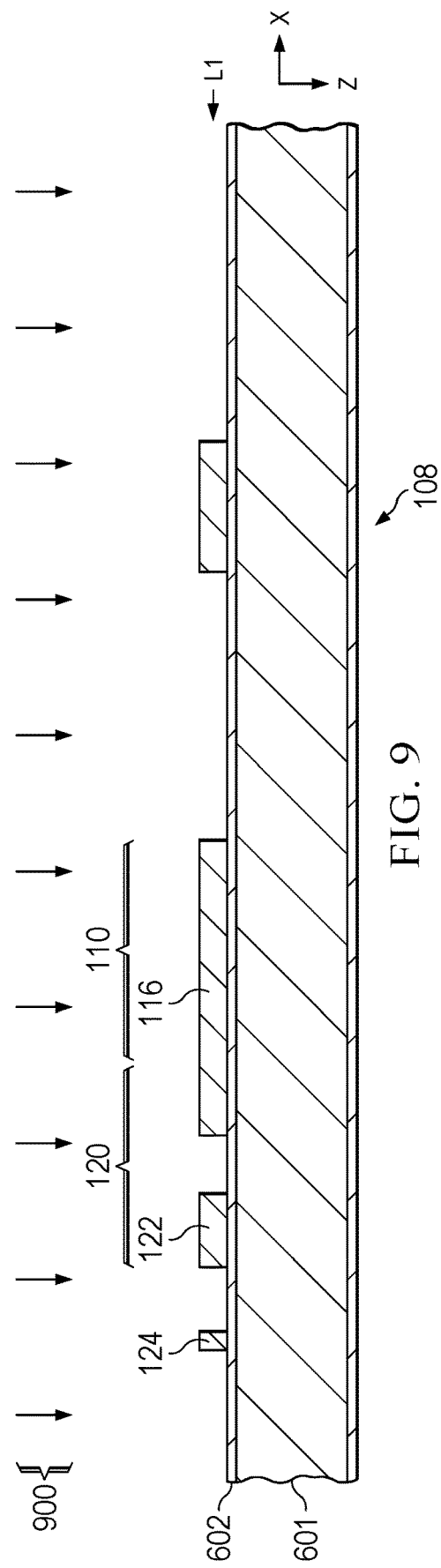

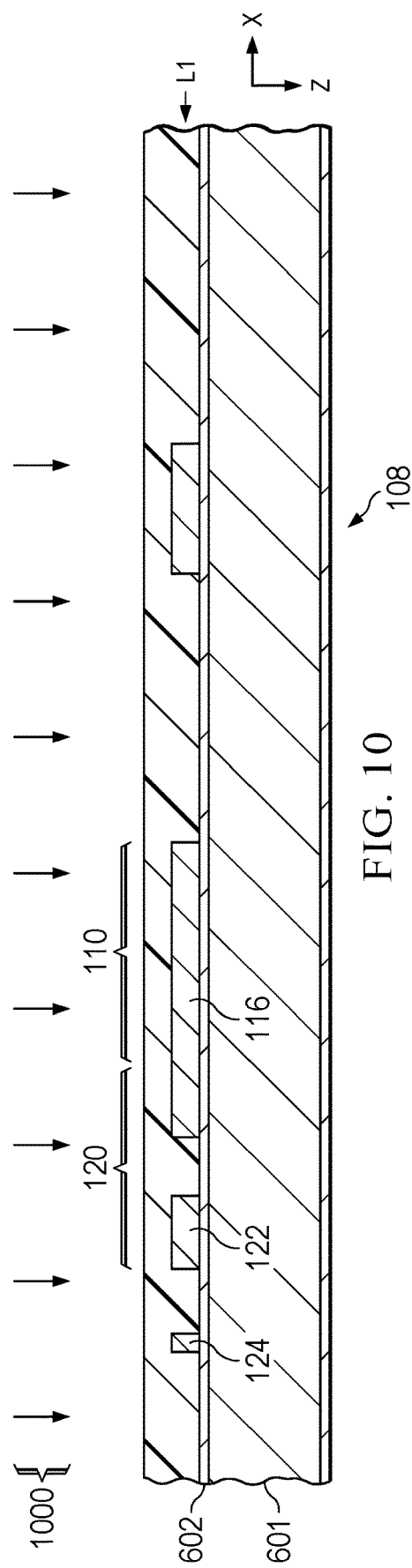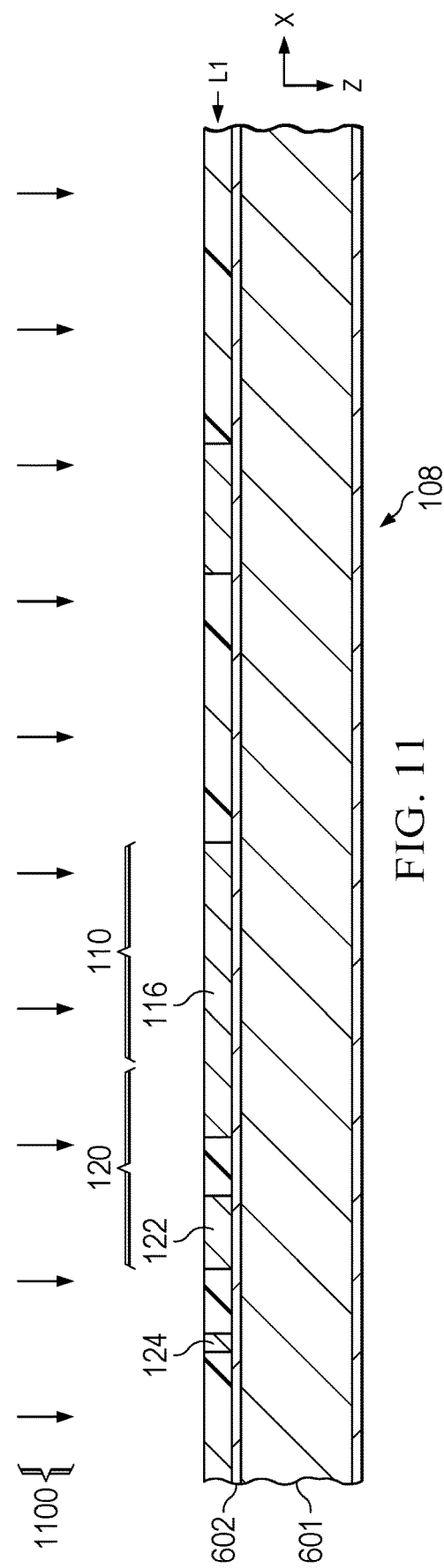

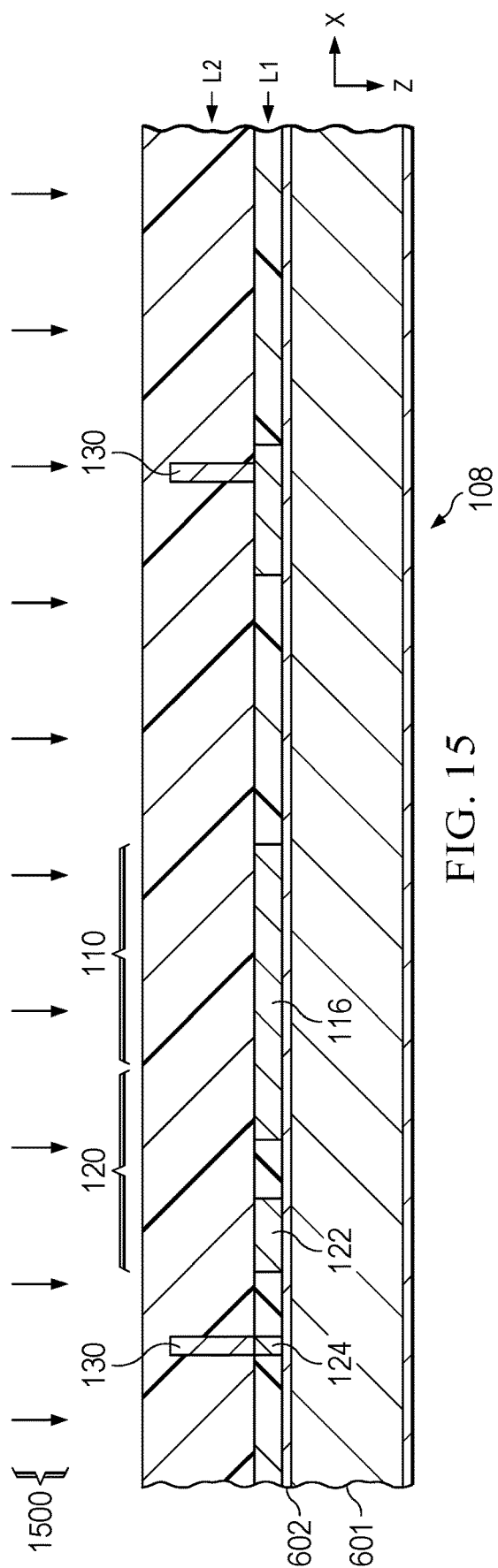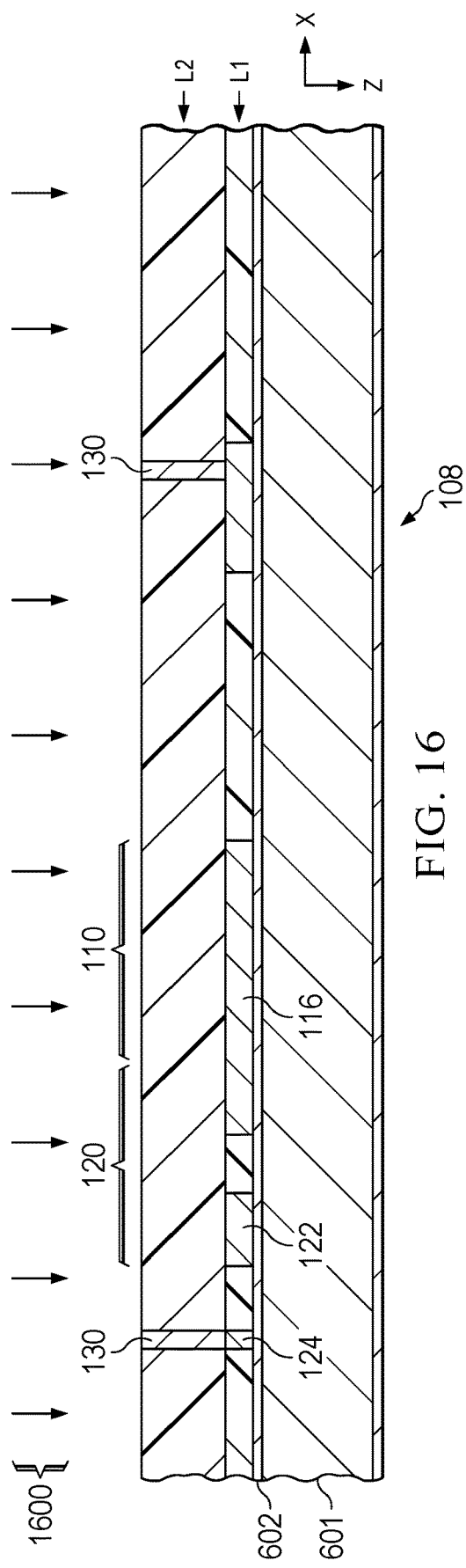

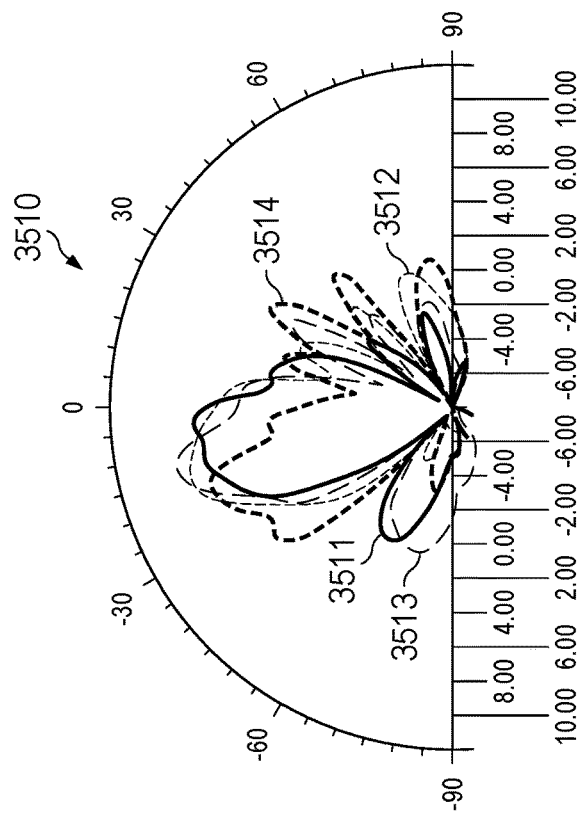
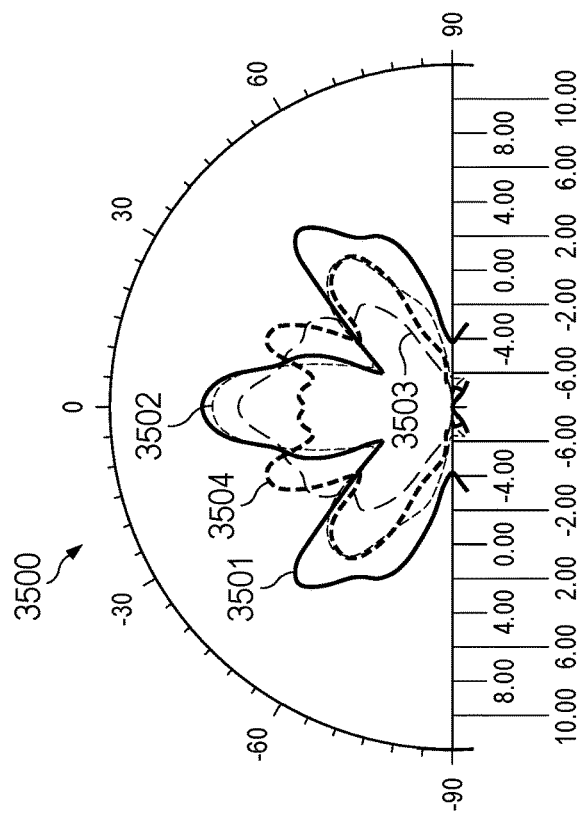
FIG. 35

FLIP-CHIP ENHANCED QUAD FLAT NO-LEAD ELECTRONIC DEVICE WITH CONDUCTOR BACKED COPLANAR WAVEGUIDE TRANSMISSION LINE FEED IN MULTILEVEL PACKAGE SUBSTRATE

CROSS-REFERENCE TO RELATED APPLICATION

This application claims priority to and benefit of U.S. Provisional Patent Application No. 63/228,566, filed on Aug. 2, 2021, and titled "Transmission Line Manufactured in RLF for Antenna on Package and High Speed Transmission", the contents of which are hereby fully incorporated by reference.

BACKGROUND

Integrating antennas in packaged electronic devices helps reduce system size, increase component density and support device communications, for example, mm-wave communications for automotive, telecommunications, industrial, and other applications. However, improved transmission line and packaged transitions for integrated antennas are desired for better antenna system performance.

SUMMARY

In one aspect, an electronic device includes a multilevel package substrate with first through fourth levels, conductive leads in the fourth level, a semiconductor die mounted to the first level, and a conductor backed coplanar waveguide transmission line feed in the multilevel package substrate. The package substrate levels include a respective dielectric layer and respective patterned conductive features and extend in respective planes of a first direction and an orthogonal second direction. The semiconductor die is mounted to the first level and has conductive pads and conductive terminals coupled to respective ones of the conductive pads. A package structure encloses the semiconductor die and a portion of the multilevel package substrate. The conductor backed coplanar waveguide transmission line feed includes an interconnect and a conductor. The interconnect includes coplanar first, second, and third conductive lines extending in the first level along the first direction from respective ends to an antenna. The second and third conductive lines are spaced apart from opposite sides of the first conductive line along the second direction. The ends of the first, second, and third conductive lines are coupled to respective ones of the conductive terminals of the semiconductor die. The conductor extends in the third level under the interconnect and under the antenna.

In another aspect, a multilevel package substrate includes four levels and a conductor backed coplanar waveguide transmission line feed. The first level has a first dielectric layer and first patterned conductive features in a first plane of a first direction and an orthogonal second direction. The second level has a second dielectric layer and second patterned conductive features in a second plane of the first and second directions. The third level has a third dielectric layer and third patterned conductive features in a third plane of the first and second directions, and the second level extends between the first and third levels along a third direction that is orthogonal to the first and second directions. The fourth level has a fourth dielectric layer and fourth patterned conductive features in a fourth plane of the first and second directions, and the third level extends between the second and fourth levels along the third direction. The conductor backed coplanar waveguide transmission line feed includes an interconnect and a conductor. The interconnect includes coplanar first, second, and third conductive lines that extend in the first level along the first direction from respective ends to an antenna. The second and third conductive lines spaced apart from opposite sides of the first conductive line along the second direction. The conductor extends in the third level under the interconnect and under the antenna.

In a further aspect, a method includes fabricating a multilevel package substrate, includes forming a first level, a second level, a third level, a fourth level, conductive leads in the fourth level, and a conductor backed coplanar waveguide transmission line feed with an having coplanar first, second, and third conductive lines extending in the first level along a first direction from respective ends to an antenna, the second and third conductive lines spaced apart from opposite sides of the first conductive line along an orthogonal second direction, and a conductor extending in the third level under the interconnect and under the antenna. The method also includes flip-chip attaching a semiconductor die to the first level with and conductive terminals of the semiconductor die soldered to respective ones of the first, second, and third conductive lines of the interconnect, performing a molding process that forms a package structure that encloses the die and a portion of the first level of the multilevel package substrate, and performing a package separation process that separates individual electronic device from a concurrently processed panel or array structure and forms sides of the conductive leads that are exposed along respective coplanar sides of the package structure.

BRIEF DESCRIPTION OF THE DRAWINGS

FIGS. 6-30 are partial side elevation views of the electronic device of FIG. 1 undergoing fabrication processing according to the method of FIG. 5.

FIG. 35 shows spherical coordinate system radiation graphs at two different angles for the electronic device of FIG. 1.

DETAILED DESCRIPTION

Figure 1:
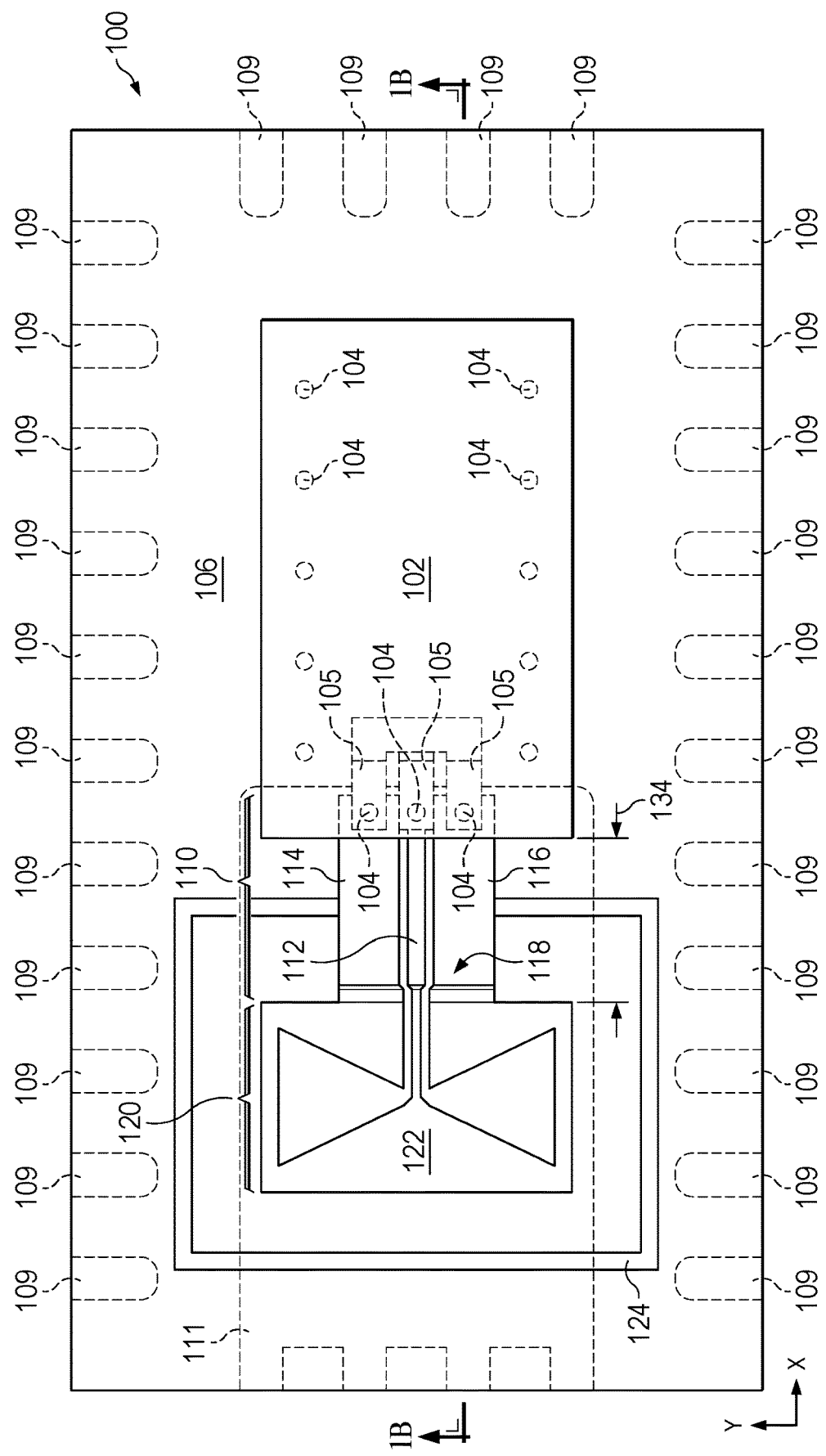
FIG. 1 is a top plan view of an electronic device with a no-lead package, a flip-chip mounted semiconductor die, and a multilevel package substrate with integrated bowtie antenna and a conductor backed coplanar waveguide transmission line feed.

In the drawings, like reference numerals refer to like elements throughout, and the various features are not necessarily drawn to scale. Also, the term "couple" or "couples" includes indirect or direct electrical or mechanical connection or combinations thereof. For example, if a first device couples to or is coupled with a second device, that connection may be through a direct electrical connection, or through an indirect electrical connection via one or more intervening devices and connections. One or more operational characteristics of various circuits, systems and/or components are hereinafter described in the context of functions which in some cases result from configuration and/or interconnection of various structures when circuitry is powered and operating. The example structures include layers or materials described as over or on another layer or material, which can be a layer or material directly on and contacting the other layer or material where other materials, such as impurities or artifacts or remnant materials from fabrication processing may be present between the layer or material and the other layer or material. Unless otherwise stated, "about," "approximately," or "substantially" preceding a value means +/-10 percent of the stated value.

Figure 1A:
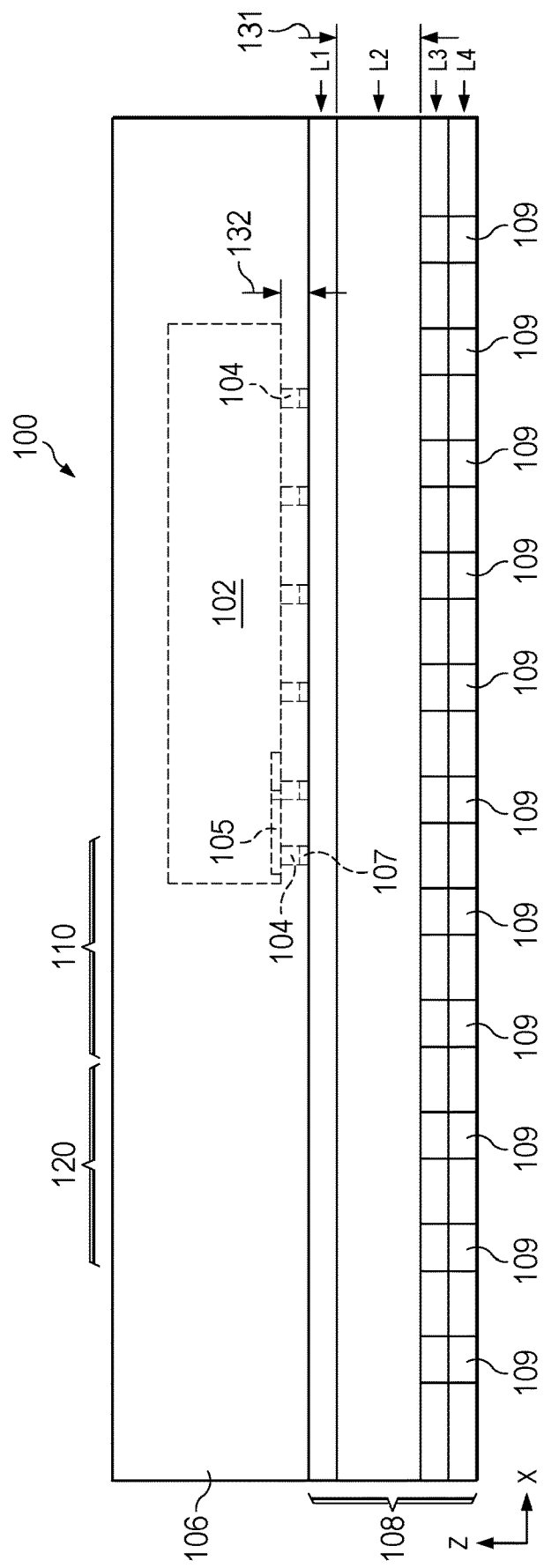
FIG. 1A is a side elevation view of the electronic device of FIG. 1.
Figure 1B:
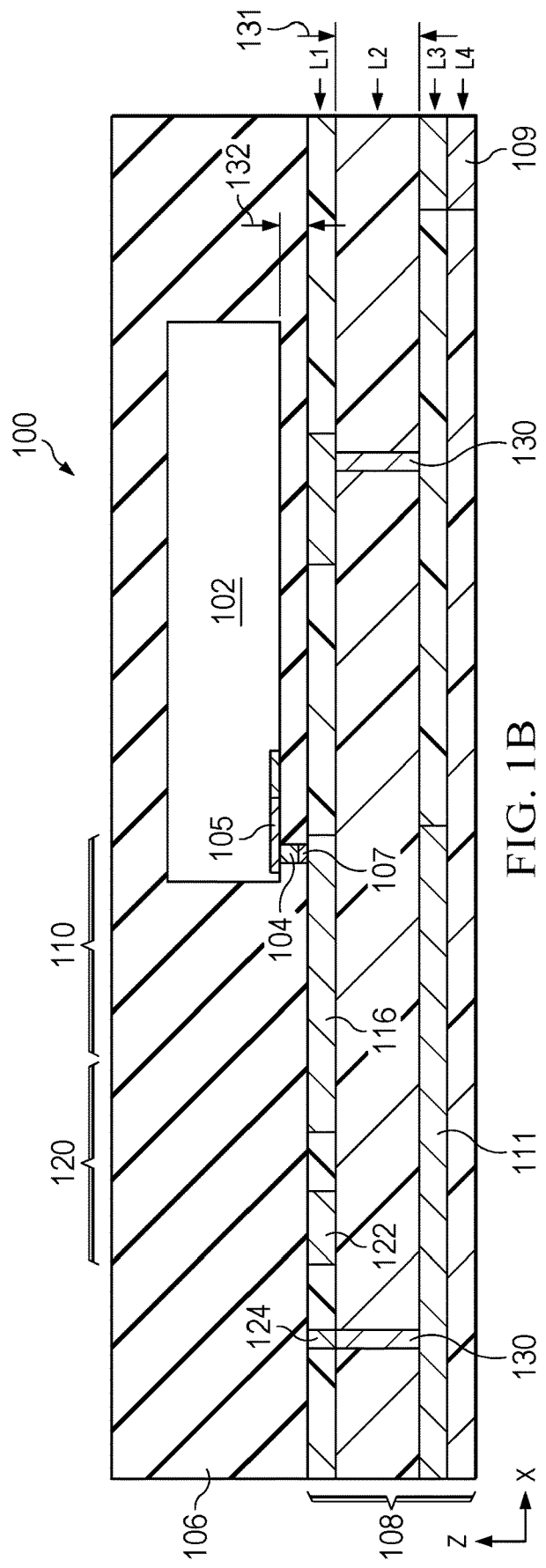
FIG. 1B is a sectional side elevation view of the electronic device taken along line 1B-1B of FIG. 1.
Figure 1C:
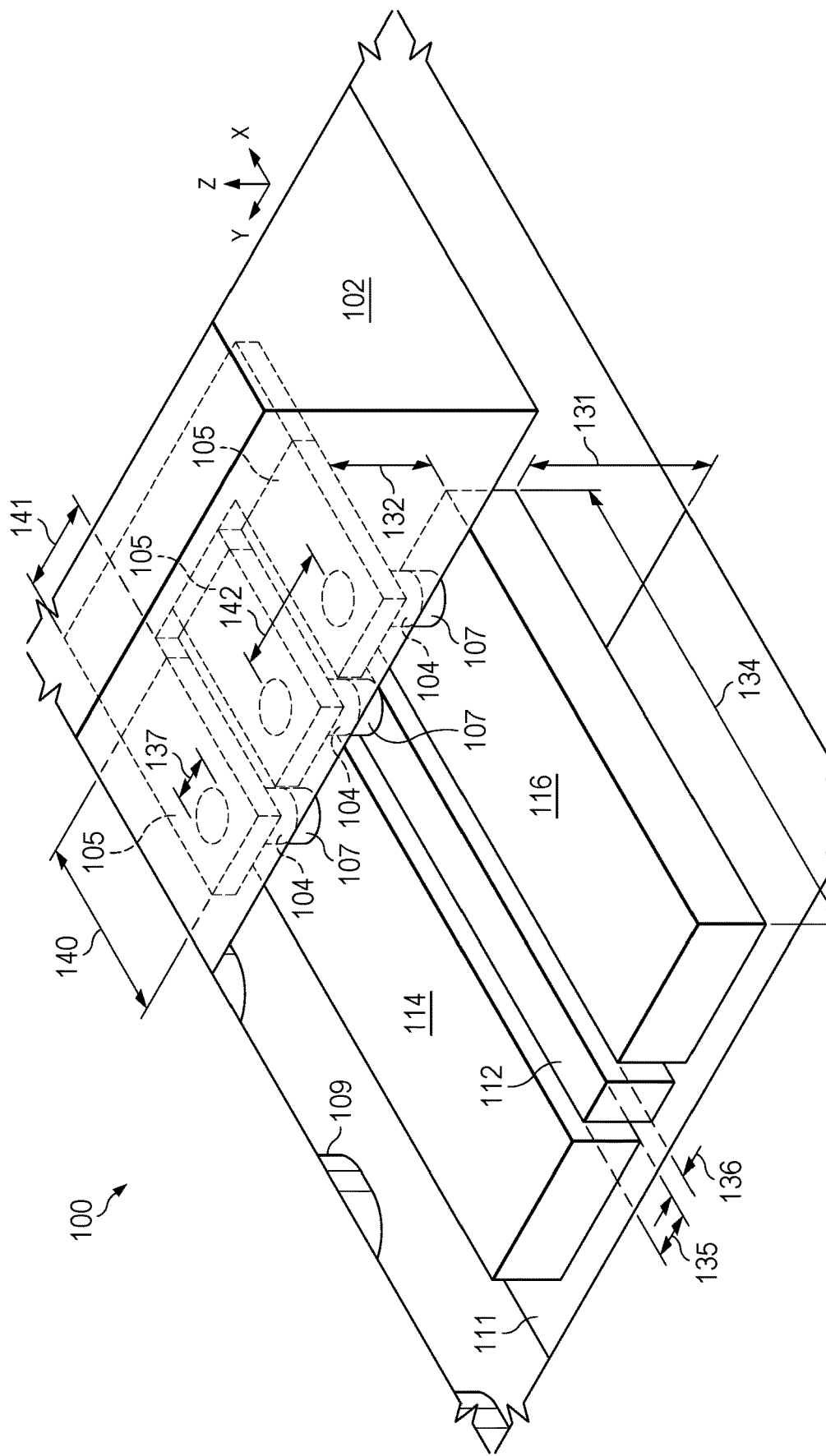
FIG. 1C is a partial top perspective view of the conductor backed coplanar waveguide transmission line feed in the electronic device of FIG. 1.
Figure 1D:
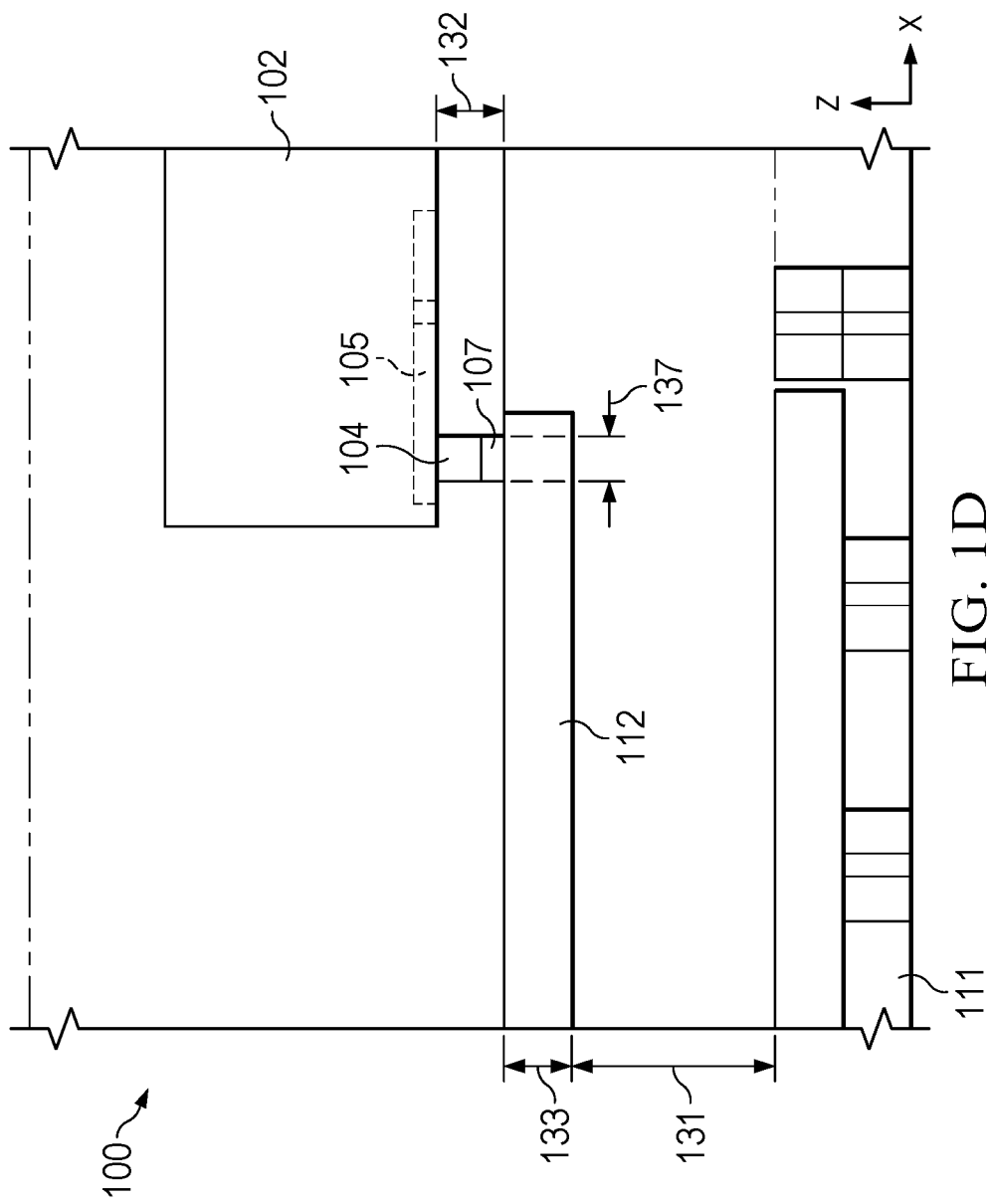
FIG. 1D is a partial side elevation view of the conductor backed coplanar waveguide transmission line feed in the electronic device of FIG. 1.
Figure 1E:
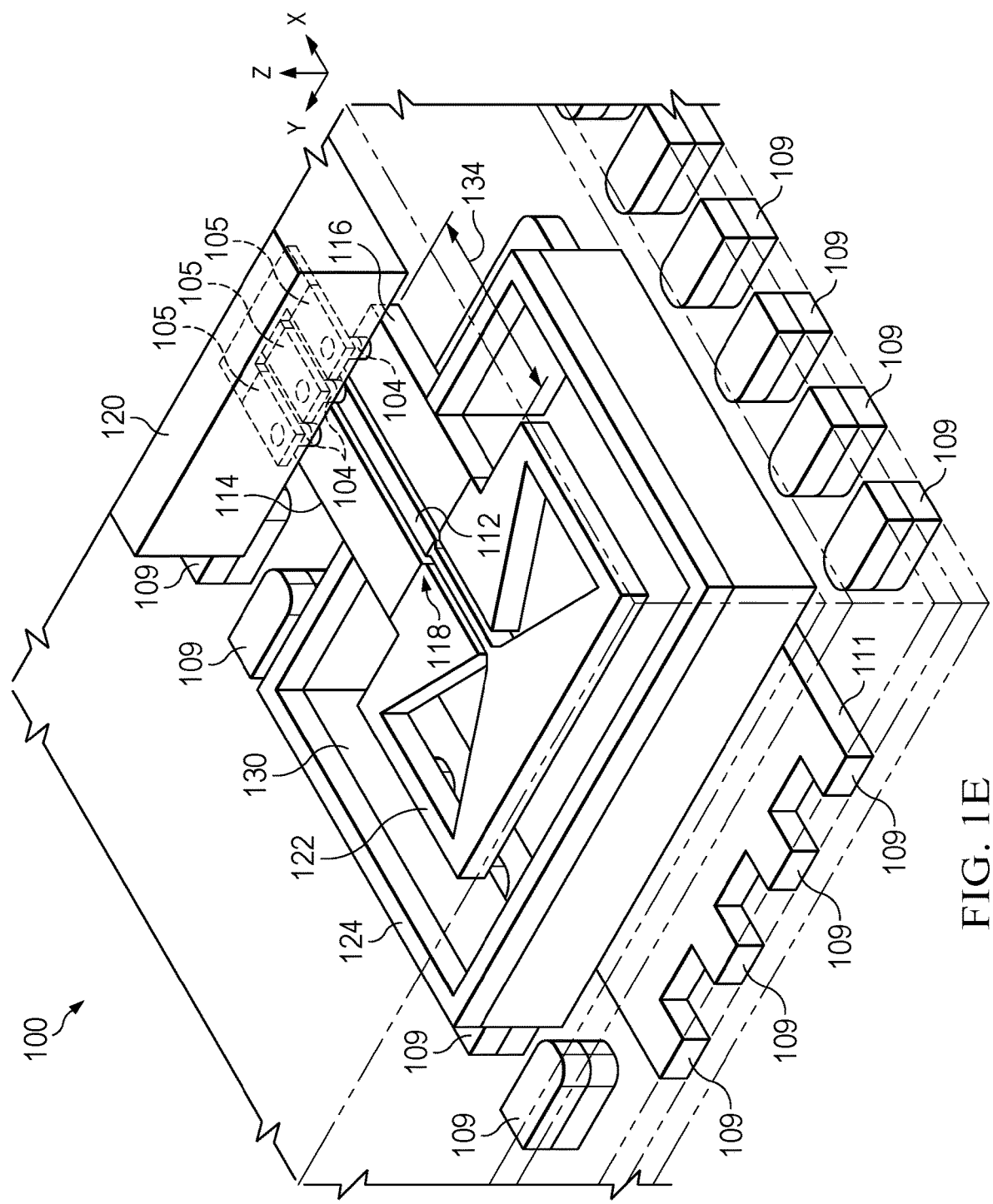
FIG. 1E is a partial top perspective view of the conductor backed coplanar waveguide transmission line feed in the electronic device of FIG. 1.

FIGS. 1 through 1E show an electronic device 100 (e.g., an integrated circuit) packaged in a quad flat no-lead (QFN) structure with a flip-chip mounted semiconductor die 102 to provide a flip-chip enhanced QFN (FCeQFN) package for millimeter wavelength applications. The semiconductor die 102 has conductive terminals 104 and conductive pads 105 coupled to respective ones of the conductive terminals 104. In one example, the conductive pads 105 are or include aluminum. In this or another implementation, the conductive terminals 104 are or include copper. A molded package structure 106 encloses the semiconductor die 102 and a portion of a multilevel package substrate 108. The conductive pads 105 are mechanically and electrically connected to conductive features of the multilevel package substrate 108 by solder bumps or connections 107 as shown in FIGS. 1A-1D.

The conductive pads 105 and the conductive terminals 104 provide an RF interconnect in a ground-signal-ground (GSG) configuration in one example with aluminum pads 105 extending as a coplanar waveguide (CPW) from the silicon back-end-of-line (BEOL) of the semiconductor die by three conductive lines or traces in the multilevel package substrate 108. On the semiconductor die 102, the conductive pads 105 are extended as a CPW transmission line having a length of approximately 40 µm. The transition through the conductive terminals 104 and the solder bumps 107 and the multilevel package substrate 108 provides a conductor backed coplanar waveguide (CBCPW) with a length of approximately 500 µm and the RF signal flows from the CPW on the semiconductor die 102 to the CBCPW on the multilevel package substrate 108 through the conductive terminals 104 and the solder bumps 107 interconnect. The conductor backed coplanar waveguide provides an electromagnetic feed line for high frequency signals, and the electronic device 100 has an integrated slot bowtie (SBT) antenna with a −10 dB bandwidth of 80 GHz and a peak gain of approximately 8 dBi in the WR5 band of 140 to 220 GHz. The electronic device 100 provides an integrated antenna-in-package (AiP) or antenna-on-package (AoP) transmission line in a multilevel package substrate solution for radio frequency (RF) front end modules for 6G network applications and other uses with integrated reflectors and feed elements for the antenna.

Figure 2:
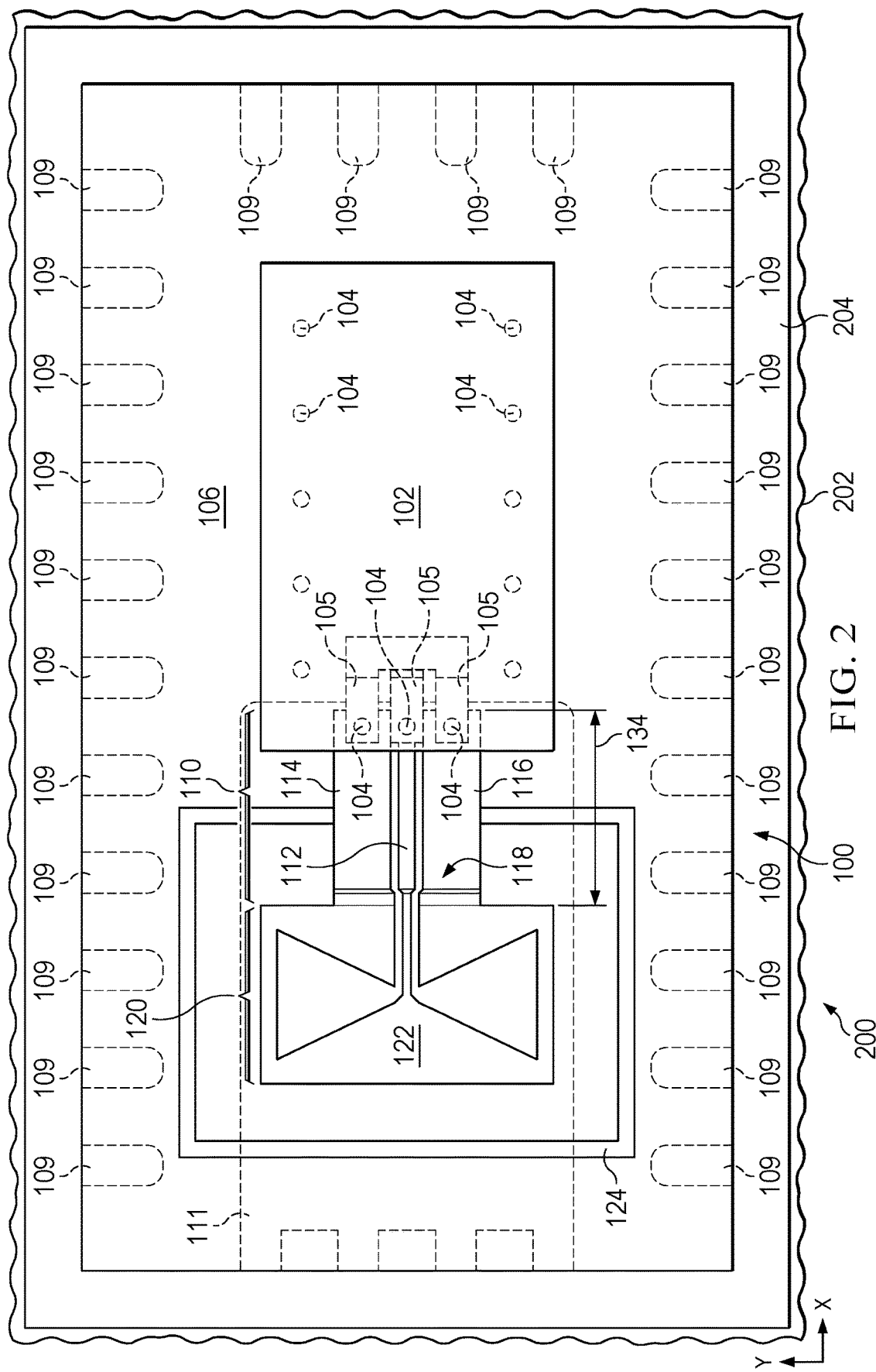
FIG. 2 is a partial top view of a printed circuit board system including the electronic device of FIG. 1.

The multilevel package substrate 108 has a generally rectangular shape with a first level L1, a second level L2, a third level L3, and a fourth level L4 with conductive leads 109 that allow the electronic device to be soldered to a host printed circuit board or other host system structure (e.g., as shown in FIG. 2 below). In another implementation (not shown), the multilevel package substrate 108 includes more than four levels, with conductive leads 109 on the final or lowest level. In one example, the electronic device 100 has leads 109 along four sides (e.g., QFN configuration). In another example electronic device 100 has leads 109 along fewer than four sides. The electronic device 100 has a length along the first direction X of approximately 6 mm and a width along the second direction Y of approximately 3.3 mm.

As shown in FIGS. 1A and 1B, the levels L1-L4 each include a respective dielectric layer and respective patterned conductive features (e.g., patterned copper trace layers) and extend in respective first, second, third, and fourth planes of a first direction X and an orthogonal second direction Y. The layers L1-L4 are arranged in a stack along a third direction Z that is orthogonal to the first and second directions X and Y. The first level L1 has a first dielectric layer and first patterned conductive features in the first X-Y plane, the second level L2 has a second dielectric layer and second patterned conductive features in the second X-Y plane, and the third level L3 has a third dielectric layer and third patterned conductive features in the third X-Y plane. The second level L2 extends between the respective first and third levels L1 and L3 along the third direction Z. The fourth level L4 has a fourth dielectric layer and fourth patterned conductive features in the fourth X-Y plane, and the third level L3 extends between the respective second and fourth levels L2 and L4 along the third direction Z.

The multilevel package substrate 108 provides the conductor backed coplanar waveguide transmission line feed, including an interconnect 110 in the first level L1 and a conductor 111 (e.g., a reflector) in the third level L3. The interconnect 110 includes respective coplanar first, second, and third conductive lines 112, 114, and 116. The first conductive line 112 in one example has a narrowing tapered portion 118. The conductive lines 112, 114, and 116 extend in the first level L1 along the first direction X from respective ends proximate the semiconductor die 102 to an antenna 120. The antenna 120 includes a conductive structure 122 with bowtie-shaped openings. The first conductive line 112 extends to the center of the conductive structure 122 and the second and third conductive lines 114 and 116 extend to respective outer portions of the conductive structure 122 as shown in FIGS. 1 and 1E. The second and third conductive lines 114 and 116 are spaced apart from opposite sides of the first conductive line 112 along the second direction Y. The conductor 111 extends in the third level L3 of the multilevel package substrate 108 under the interconnect 110 and under the antenna 120.

The multilevel package substrate 108 in FIGS. 1-1E also includes a conductive wall 124 extending around the antenna 120 in the first, second, and third levels L1-L3. The conductive wall 124 is connected to the second and third conductive lines 114 and 116 of the interconnect 110 as shown in FIGS. 1 and 1E. The conductive wall 124 extends laterally around the periphery of the antenna 120 to help isolate the antenna 120 from surrounding metal layers, including those of a host printed circuit board (e.g., FIG. 2 below) to improve directivity and gain in the WR5 band. In another implementation (not shown), the conductive wall 124 includes conductive features of the fourth level L4. In one example, the conductive wall 124 has a width of approximately 150 µm and a height along the third direction Z of approximately 195 µm and extends around the antenna periphery with ends connected to the respective second and third conductive lines 114 and 116 in the first level L1.

As further shown in FIG. 1B, the multilevel package substrate 108 provides a routing or interconnect structure for electrical coupling of circuit nodes and formation of the conductive features of the interconnect 110 and the antenna 120. In one implementation, the conductive features of the respective levels L1-L4 are or include copper, such as electroplated copper formed and patterned during fabrication as shown below in FIGS. 6-26. As shown in FIG. 1B, the second level L2 includes copper vias or interconnects 130 that form part of the conductive wall 124 and provide other circuit interconnections between the respective first and third levels L1 and L3. As shown in FIGS. 1A and 1B, the interconnects 130 have a height 131 that sets the spacing between the conductive features of the first and third levels L1 and L3 along the third direction Z, for example, approximately 10 to 30 µm. The lower side of the semiconductor die 102 is spaced along the third direction Z by a spacing distance 132 (e.g., FIGS. 1A-1D) set by the height of the conductive terminals 104 and the thickness of the solder bumps 107 following flip-chip solder reflow, for example, approximately 20 to 200 µm. The conductive features of the first level L1, including the conductive lines 112, 114, and 116, have a thickness 133, for example, approximately 10 to 30 µm.

As shown in FIG. 1C, the ends of the first, second, and third conductive lines 112, 114, and 116 are coupled to respective ones of the conductive terminals 104 of the semiconductor die 102 by the respective solder bumps 107. As shown in FIGS. 1, 1C, and 1E in the WR5 example electronic device 100, the respective first, second, and third conductive lines 112, 114, and 116 have lengths 134 along the first direction X of 400 µm or more and 600 µm or less (e.g., approximately 500 µm) and extend along the −X direction to the antenna 120. As shown in FIGS. 1, 1B and 1E, the conductor 111 extends in the third level L3 of the multilevel package substrate 108 under the interconnect 110 and under the antenna 120. The first conductive line 112 has a width 135 along the second direction Y of 32 µm or more and 48 µm or less (e.g., approximately 40 µm). The second and third conductive lines 114 and 116 are spaced apart from the respective opposite sides of the first conductive line 112 along the second direction Y by a spacing distance 136 of 21.6 µm or more and 32.4 µm or less (e.g., approximately 27 µm). As shown in FIGS. 1C and 1D, the conductive terminals 104 have a diameter 137 in a corresponding plane of the first and second directions X and Y of 24 µm or more and 36 µm or less (e.g., approximately 30 µm). As also shown in FIG. 1C, the conductive pads 105 of the semiconductor die 102 have a length 140 along the first direction X of 64 µm or more and 96 µm or less (e.g., approximately 80 µm) and the conductive pads 105 have a width 141 along the second direction Y of 32 µm or more and 48 µm or less (e.g., approximately 40 µm). The centers of the respective conductive pads 105 are spaced apart from one another along the second direction Y by a pitch distance 142 of 48 µm or more and 72 µm or less (e.g., approximately 60 µm) as also shown in FIG. 1C.

FIG. 2 shows a partial top view of a printed circuit board system 200 including the electronic device 100 of FIG. 1. In this example, the system includes a printed circuit board 202, a portion of which is shown in FIG. 2, and a top copper layer of the printed circuit board 202 has a conductive (e.g., copper) feature 204, which provides a ground plane that latterly encircles the electronic device 100. The conductive wall 124 in this example extends around the periphery of the antenna 120 and helps to isolate the antenna 120 from the surrounding mental feature 204 in order to improve the antenna directivity and the gain in the WR5 band.

Figure 3:
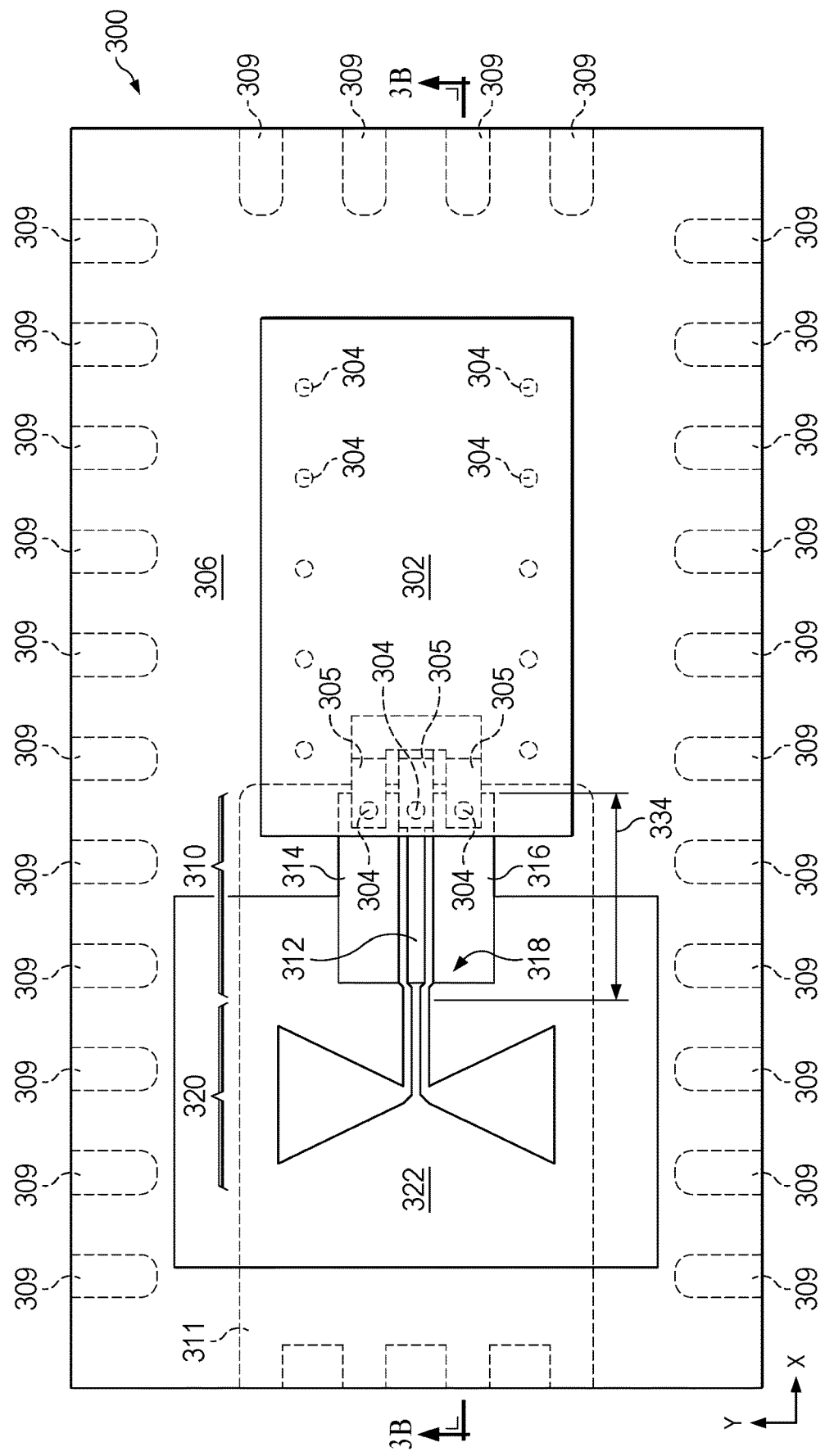
FIG. 3 is a top plan view of an electronic device with a no-lead package, a flip-chip mounted semiconductor die, and a multilevel package substrate with integrated bowtie antenna and a conductor backed coplanar waveguide transmission line feed.
Figure 3A:
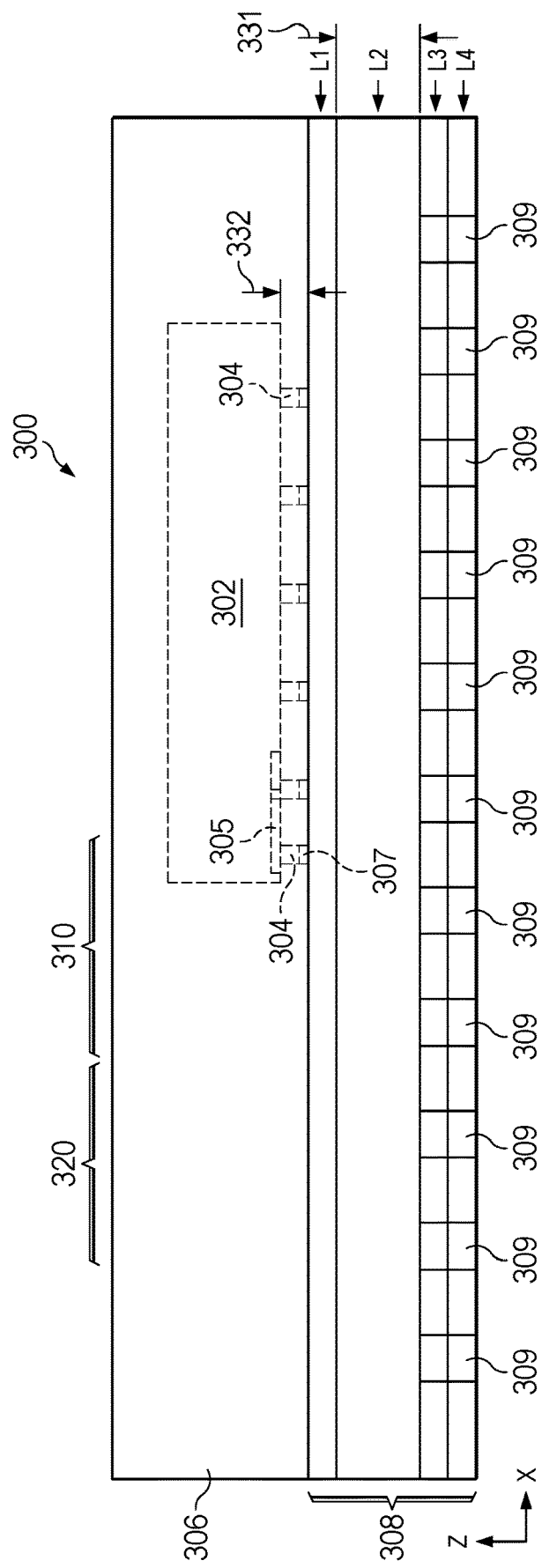
FIG. 3A is a side elevation view of the electronic device of FIG. 3.
Figure 3B:
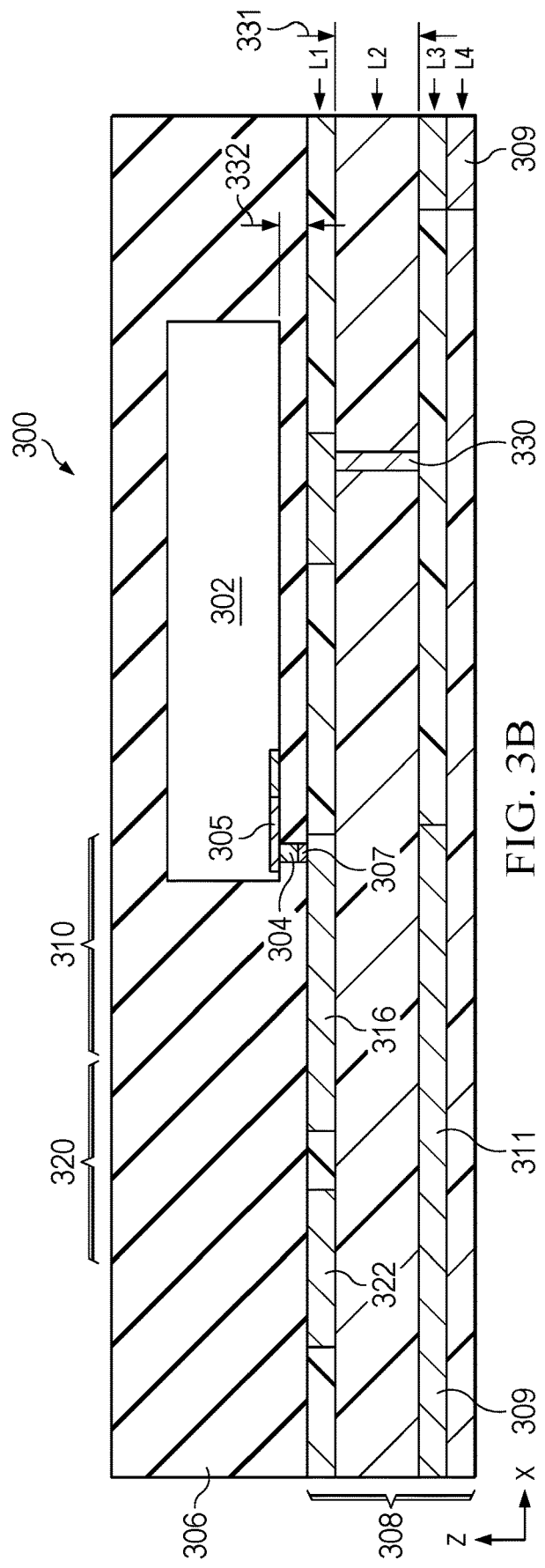
FIG. 3B is a sectional side elevation view of the electronic device taken along line 3B-3B of FIG. 3.
Figure 3C:
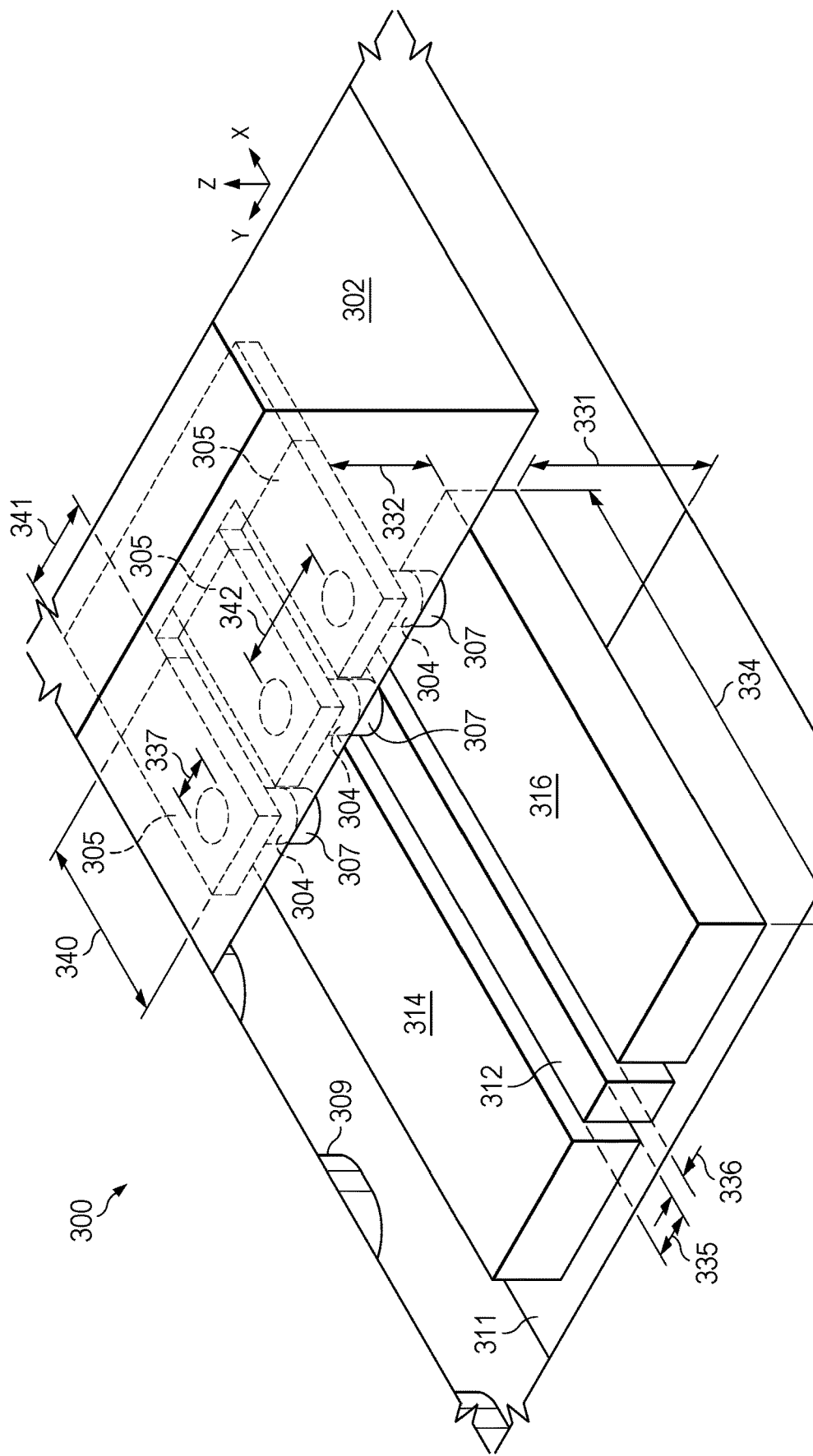
FIG. 3C is a partial top perspective view of the conductor backed coplanar waveguide transmission line feed in the electronic device of FIG. 3.
Figure 3D:
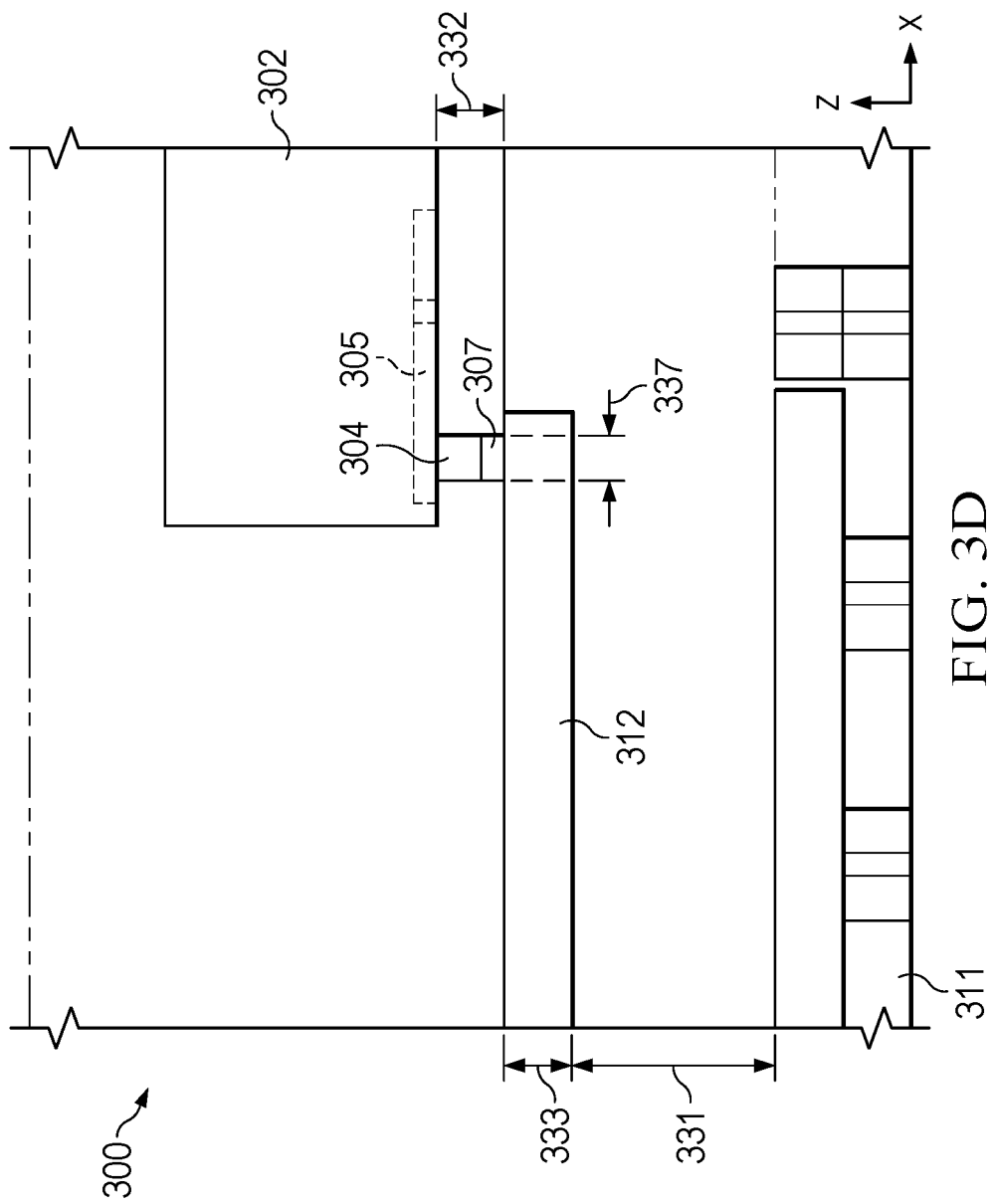
FIG. 3D is a partial side elevation view of the conductor backed coplanar waveguide transmission line feed in the electronic device of FIG. 3.
Figure 4:
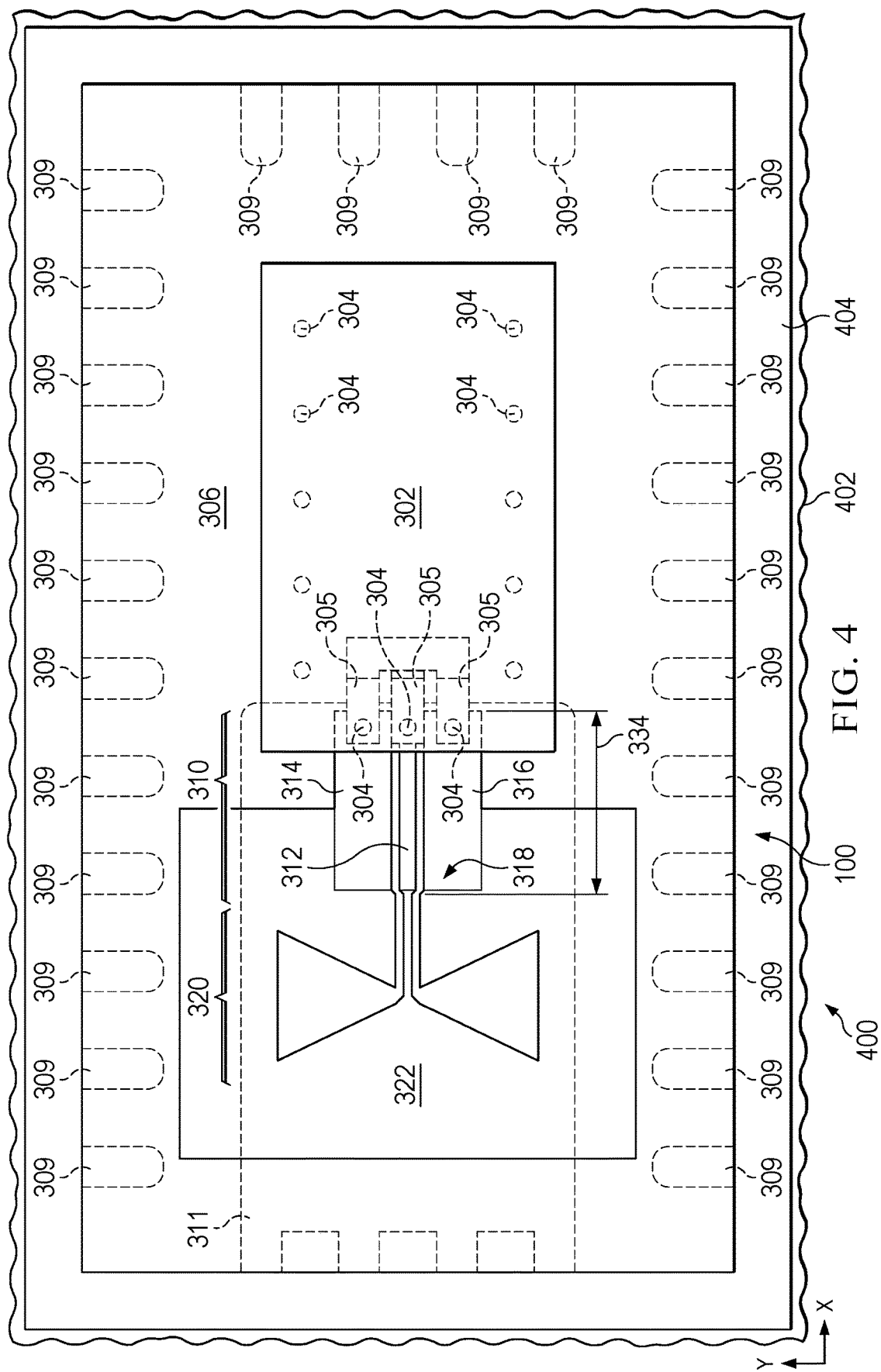
FIG. 4 is a partial top view of a printed circuit board system including the electronic device of FIG. 3.

Referring now to FIGS. 3-4, FIGS. 3-3D show another example electronic device 300, and FIG. 4 shows a printed circuit board system including the electronic device 300 of FIG. 3. The electronic device 300 (e.g., an integrated circuit) in this example is packaged in a quad flat no-lead (QFN) structure with a flip-chip mounted semiconductor die 302 to provide a flip-chip enhanced QFN (FCeQFN) package for millimeter wavelength applications. The semiconductor die 302 has conductive terminals 304 and conductive pads 305 coupled to respective ones of the conductive terminals 304. In one example, the conductive pads 305 are or include aluminum. In this or another implementation, the conductive terminals 304 are or include copper. A molded package structure 306 encloses the semiconductor die 302 and a portion of a multilevel package substrate 308. The conductive pads 305 are mechanically and electrically connected to conductive features of the multilevel package substrate 308 by solder bumps or connections 307 as shown in FIGS.

The conductive pads 305 and the conductive terminals 304 provide an RF interconnect in a ground-signal-ground configuration in one example with aluminum pads 305 extending as a coplanar waveguide from the silicon back-end-of-line of the semiconductor die by three conductive lines or traces in the multilevel package substrate 308. On the semiconductor die 302, the conductive pads 305 are extended as a CPW transmission line having a length of approximately 40 µm. The transition through the conductive terminals 304 and the solder bumps 307 and the multilevel package substrate 308 provides a conductor backed coplanar waveguide with a length of approximately 500 µm and the RF signal flows from the CPW on the semiconductor die 302 to the CBCPW on the multilevel package substrate 308 through the conductive terminals 304 and the solder bumps 307 interconnect. The conductor backed coplanar waveguide provides an electromagnetic feed line for high frequency signals, and the electronic device 300 has an integrated slot bowtie (SBT) antenna with a −10 dB bandwidth of 80 GHz and a peak gain of approximately 7 dBi in the WR8 band of 90 to 140 GHz. The electronic device 300 provides an integrated antenna-in-package (AiP) or antenna-on-package (AoP) transmission line in a multilevel package substrate solution for radio frequency (RF) front end modules for 6G network applications and other uses with integrated reflectors and feed elements for the antenna.

The multilevel package substrate 308 has a generally rectangular shape with a first level L1, a second level L2, a third level L3, and a fourth level L4 with conductive leads 309 that allow the electronic device to be soldered to a host printed circuit board or other host system structure (e.g., as shown in FIG. 2 below). In another implementation (not shown), the multilevel package substrate 308 includes more than four levels, with conductive leads 309 on the final or lowest level. In one example, the electronic device 300 has leads 309 along four sides (e.g., QFN configuration). In another example electronic device 300 has leads 309 along fewer than four sides. The electronic device 300 has a length along the first direction X of approximately 6 mm and a width along the second direction Y of approximately 3.3 mm.

As shown in FIGS. 3A and 3B, the levels L1-L4 each include a respective dielectric layer and respective patterned conductive features and extend in respective first, second, third, and fourth planes of a first direction X and an orthogonal second direction Y. The layers L1-L4 are arranged in a stack along a third direction Z that is orthogonal to the first and second directions X and Y. The first level L1 has a first dielectric layer and first patterned conductive features in the first X-Y plane, the second level L2 has a second dielectric layer and second patterned conductive features in the second X-Y plane, and the third level L3 has a third dielectric layer and third patterned conductive features in the third X-Y plane. The second level L2 extends between the respective first and third levels L1 and L3 along the third direction Z. The fourth level L4 has a fourth dielectric layer and fourth patterned conductive features in the fourth X-Y plane, and the third level L3 extends between the respective second and fourth levels L2 and L4 along the third direction Z.

The multilevel package substrate 308 provides the conductor backed coplanar waveguide transmission line feed, including an interconnect 310 in the first level L1 and a conductor 311 (e.g., a reflector) in the third level L3. The interconnect 310 includes respective coplanar first, second, and third conductive lines 312, 314, and 316. The first conductive line 312 in one example has a narrowing tapered portion 318. The conductive lines 312, 314, and 316 extend in the first level L1 along the first direction X from respective ends proximate the semiconductor die 302 to an antenna 320. The antenna 320 includes a conductive structure 322 with bowtie-shaped openings. The first conductive line 312 extends to the center of the conductive structure 322 and the second and third conductive lines 314 and 316 extend to respective outer portions of the conductive structure 322 as shown in FIG. 3. The second and third conductive lines 314 and 316 are spaced apart from opposite sides of the first conductive line 312 along the second direction Y. The conductor 311 extends in the third level L3 of the multilevel package substrate 308 under the interconnect 310 and under the antenna 320.

As further shown in FIG. 3B, the multilevel package substrate 308 provides a routing or interconnect structure for electrical coupling of circuit nodes and formation of the conductive features of the interconnect 310 and the antenna 320. In one implementation, the conductive features of the respective levels L1-L4 are or include copper, such as electroplated copper formed and patterned during fabrication as shown below in FIGS. 6-26. As shown in FIG. 3B, the second level L2 includes a copper via or interconnect 330 that provides a circuit interconnection between the respective first and third levels L1 and L3. As shown in FIG. 3B, the interconnect 330 has a height 331 that sets the spacing between the conductive features of the first and third levels L1 and L3 along the third direction Z, for example, approximately 10 to 30 µm. The lower side of the semiconductor die 302 is spaced along the third direction Z by a spacing distance 332 (e.g., FIGS. 3A-3D) set by the height of the conductive terminals 304 and the thickness of the solder bumps 307 following flip-chip solder reflow, for example, approximately 20 to 200 µm. The conductive features of the first level L1, including the conductive lines 312, 314, and 316, have a thickness 333, for example, approximately 10 to 30 µm.

As shown in FIG. 3C, the ends of the first, second, and third conductive lines 312, 314, and 316 are coupled to respective ones of the conductive terminals 304 of the semiconductor die 302 by the respective solder bumps 307. As shown in FIGS. 3 and 3C in the WR8 example electronic device 300, the respective first, second, and third conductive lines 312, 314, and 316 have lengths 334 along the first direction X of 400 µm or more and 600 µm or less (e.g., approximately 500 µm) and extend along the −X direction to the antenna 320. As shown in FIGS. 3, 3B and 3C, and the conductor 311 extends in the third level L3 of the multilevel package substrate 308 under the interconnect 310 and under the antenna 320. The first conductive line 312 has a width 335 along the second direction Y of 48 µm or more and 72 µm or less (e.g., approximately 60 µm). The second and third conductive lines 314 and 316 are spaced apart from the respective opposite sides of the first conductive line 312 along the second direction Y by a spacing distance 336 of 27.2 µm or more and 40.8 µm or less (e.g., approximately 34 µm). As shown in FIGS. 3C and 3D, the conductive terminals 304 have a diameter 337 in a corresponding plane of the first and second directions X and Y of 28 µm or more and 42 µm or less (e.g., approximately 35 µm). As also shown in FIG. 3C, the conductive pads 305 of the semiconductor die 302 have a length 340 along the first direction X of 80 µm or more and 120 µm or less (e.g., approximately 100 µm) and the conductive pads 305 have a width 341 along the second direction Y of 48 µm or more and 72 µm or less (e.g., approximately 60 µm). The centers of the respective conductive pads 305 are spaced apart from one another along the second direction Y by a pitch distance 342 of 76 µm or more and 117 µm or less (e.g., approximately 95 µm) as also shown in FIG. 3C.

FIG. 4 shows a partial top view of a printed circuit board system 400 including the electronic device 300 of FIG. 3. In this example, the system includes a printed circuit board 402, a portion of which is shown in FIG. 4, and a top copper layer of the printed circuit board 402 has a conductive (e.g., copper) feature 404, which provides a ground plane that latterly encircles the electronic device 300.

Referring now to FIGS. 5-30, FIG. 5 shows a method 500 of fabricating a packaged electronic device, and FIGS. 6-30 show sectional side views of the electronic device 100 of FIGS. 1-1E undergoing fabrication according to the method 500. At 501 in FIG. 5, wafer processing is performed that fabricates the semiconductor die 102 including the conductive terminals 104 and the conductive pads 105 as described above. The fabricated semiconductor die 102 in one example includes the transmitter circuitry (not shown) to provide a radiofrequency signal to the first conductive line 112 with respect to a ground or reference voltage of the second and third conductive lines 114 and 116 during powered operation of the semiconductor die 102. The wafer level processing at 501 also includes die singulation or separation (not shown) that separates individual semiconductor dies 102 from a processed wafer.

At 502-542, the method 500 includes fabricating the above-described multilevel package substrate 108, including forming a first level L1, a second level L2, a third level L3, a fourth level L4, conductive leads 109 in the fourth level L4, and a conductor backed coplanar waveguide CBCPW transmission line feed with an interconnect 110 and a conductor 111. In the illustrated example, the multilevel package substrate fabrication also includes forming the conductive wall 124 around the antenna 120 in the first, second, and third levels L1-L3. In other implementations, the conductive wall formation is omitted (e.g., in fabricating the electronic device 300 in FIGS. 3-3D). The levels L1-L4 in one example are built one at a time starting with deposition of a seed copper layer on a metal carrier at 502. FIG. 6 shows one example, in which a chemical vapor deposition process 600 is performed that deposits a copper seed layer 602 on a metal carrier 601. The process 600 in one example deposits the copper seed layer on both the top and bottom sides of the carrier 601 in the illustrated orientation. The method 500 continues at 504 with deposition and patterning of a first plating mask. FIG. 7 shows one example, in which a process 700 is performed that deposits and patterns a first plating mask 702 on the copper seed layer 602 on the top side of the carrier 601. The method 500 continues at 506 in FIG. 5 with electroplating copper features of a first trace layer. FIG. 8 shows one example, in which an electroplating process 800 is performed that deposits copper in the exposed areas of the mask 702 to form copper features of the first level L1 on the exposed portions of the copper seed layer 602 on the top side of the carrier 601. At 508, the first plating mask is removed. FIG. 9 shows one example, in which a process 900 is performed to remove the first plating mask and leave the plated copper structures of the first level L1.

At 510, the method 500 continues with compression molding for the first level L1. FIG. 10 shows one example, in which a compression molding process 1000 is performed that compression molds a first layer of the dielectric electrically insulating material between and over the patterned conductive features of the first level L1. A grinding operation is performed at 512. FIG. 11 shows one example, in which a grinding process 1100 is performed that grinds and planarizes the top side of the structure. The grinding process 1100 removes an upper portion of the compression molded dielectric electrically insulating material to expose upper portions of the conductive features of the first level L1, and the grinding process 1100 is continued to reduce the thickness of the conductive copper and dielectric features of the first level L1 to a final thickness along the third direction Z as shown in FIG. 11.

Figure 12:
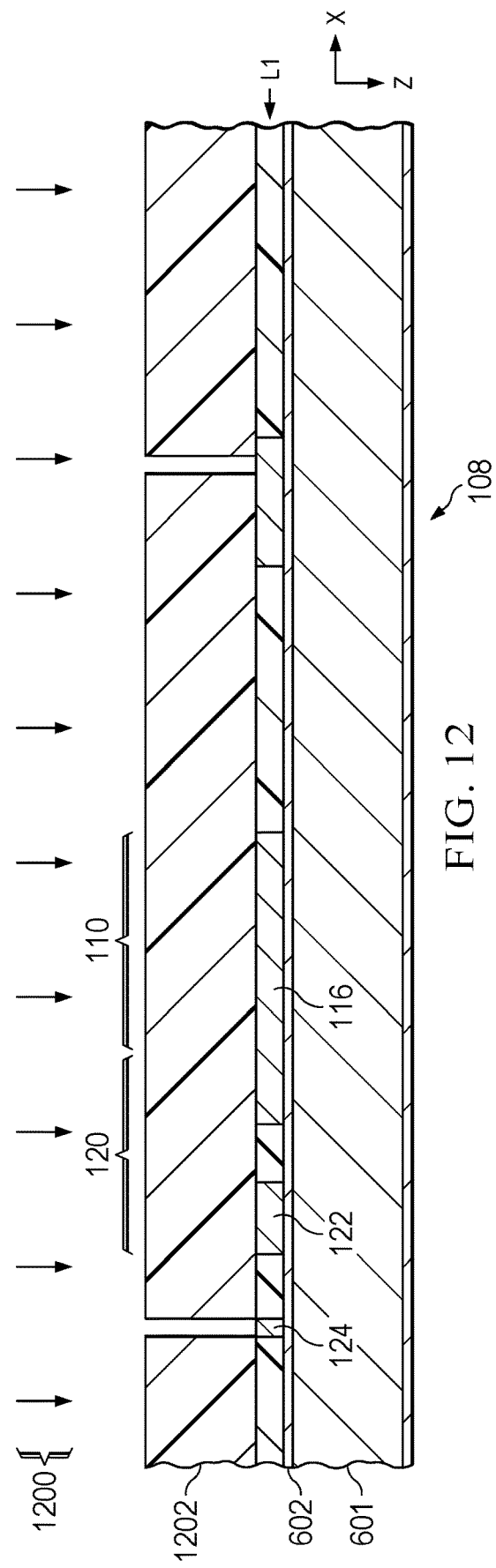
Figure 13:
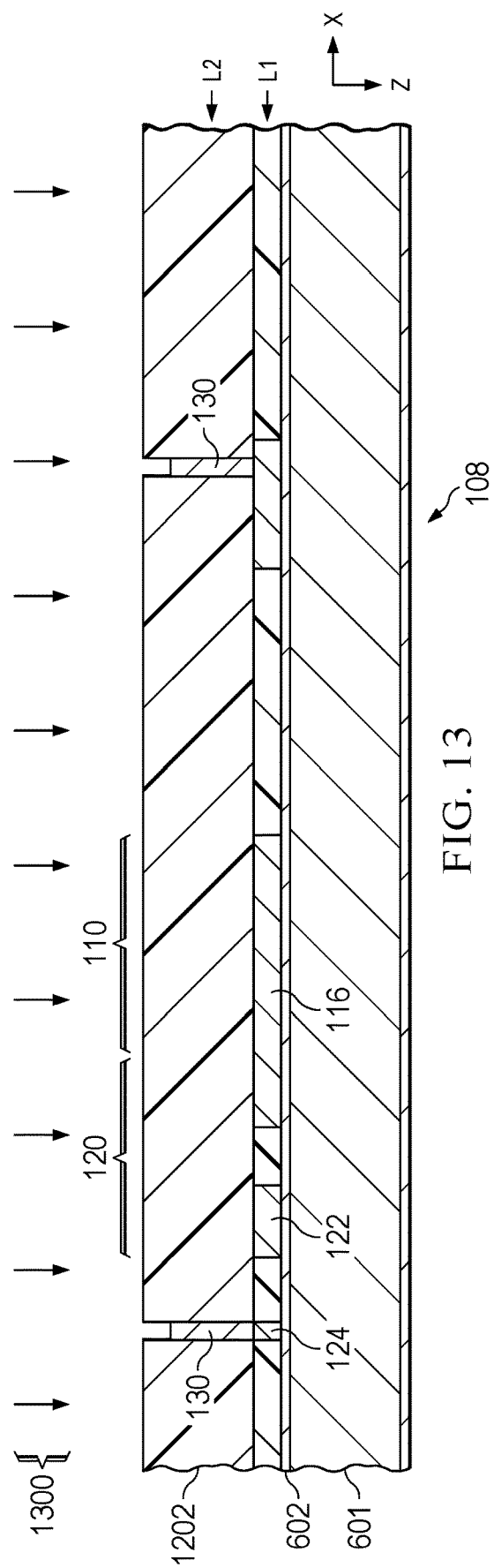
Figure 14:
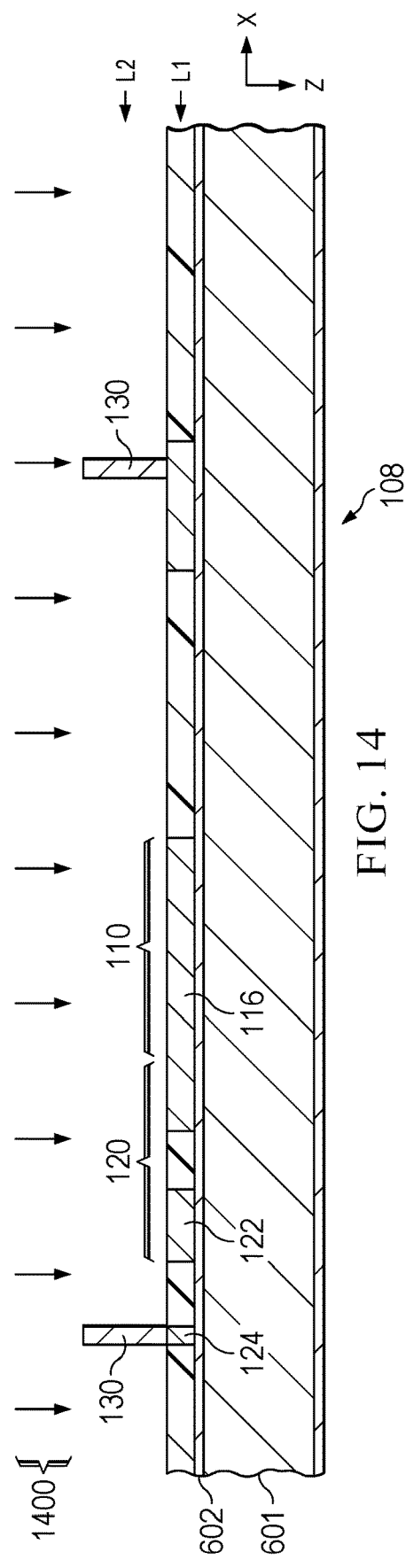

The second and subsequent levels L2-L4 are fabricated in the same or a similar sequence in one example. In another example, the conductive copper features of the second level L2 are deposited by electroplating using a second plating mask prior to the compression molding at 510, but this approach requires that the conductive features of the second level L2 be no wider than underlying conductive features of the first level L1. The illustrated example includes the compression molding 510 and grinding at 512 prior to forming the second level L2. The second level construction begins at 514 with deposition and patterning of a second plating mask. FIG. 12 shows one example, in which a process 1200 is performed that deposits and patterns a second plating mask 1202 on the top side of the first level L1. The method 500 continues at 516 in FIG. 5 with electroplating copper features of a second trace layer. FIG. 13 shows one example, in which an electroplating process 1300 is performed that deposits copper in the exposed areas of the mask 1202 to form copper features of the second level L2 on the exposed portions of the first level L1. At 518, the second plating mask is removed. FIG. 14 shows one example, in which a process 1400 is performed to remove the second plating mask and leave the plated copper structures of the second level L2. The method 500 continues with compression molding at 520 for the second level. FIG. 15 shows one example, in which a compression molding process 1500 is performed that compression molds a second layer of the dielectric electrically insulating material between and over the patterned conductive features of the second level L2. A grinding operation is performed at 522. FIG. 16 shows one example, in which a grinding process 1600 is performed that grinds and planarizes the top side of the structure. The grinding process 1600 removes an upper portion of the compression molded dielectric electrically insulating material to expose upper portions of the conductive features of the second level L2, and the grinding process 1600 is continued to reduce the thickness of the conductive copper and dielectric features of the second level L2 to a final thickness along the third direction Z as shown in FIG. 16.

Figure 17:
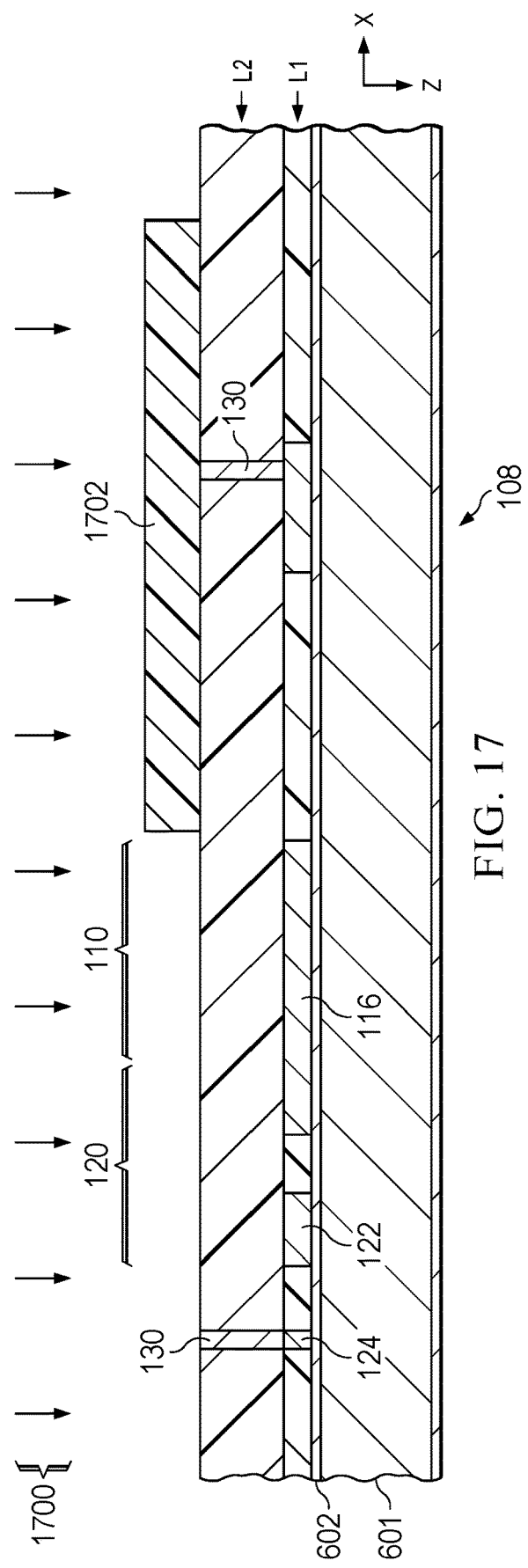
Figure 18:
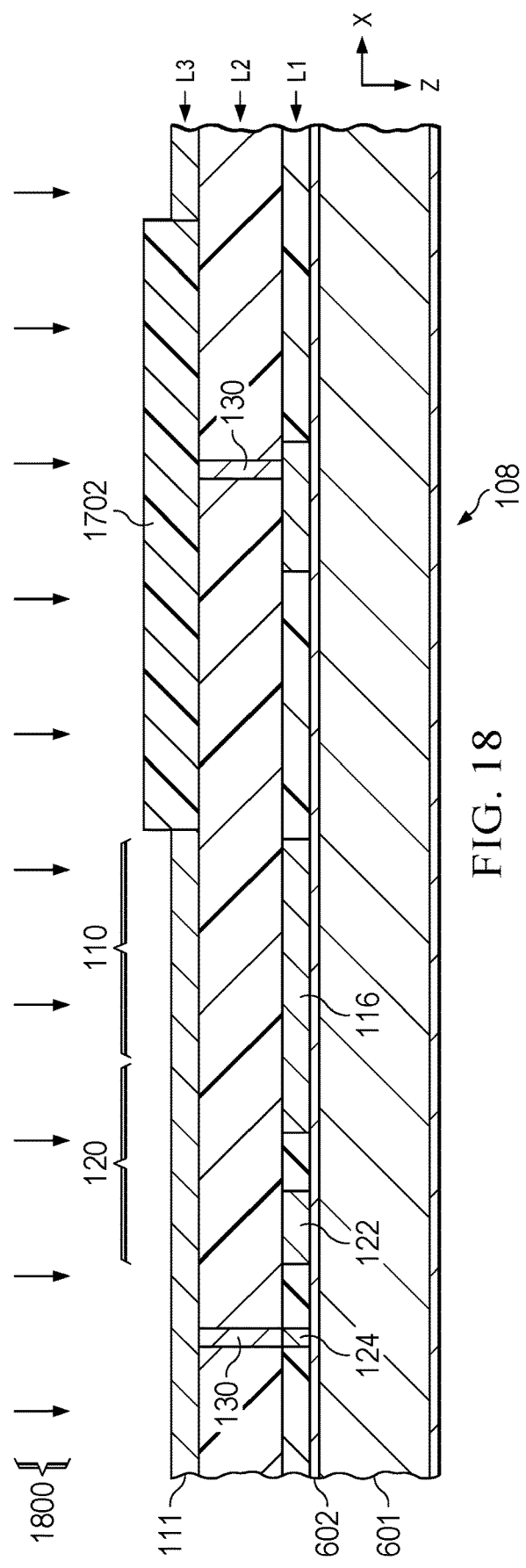
Figure 19:
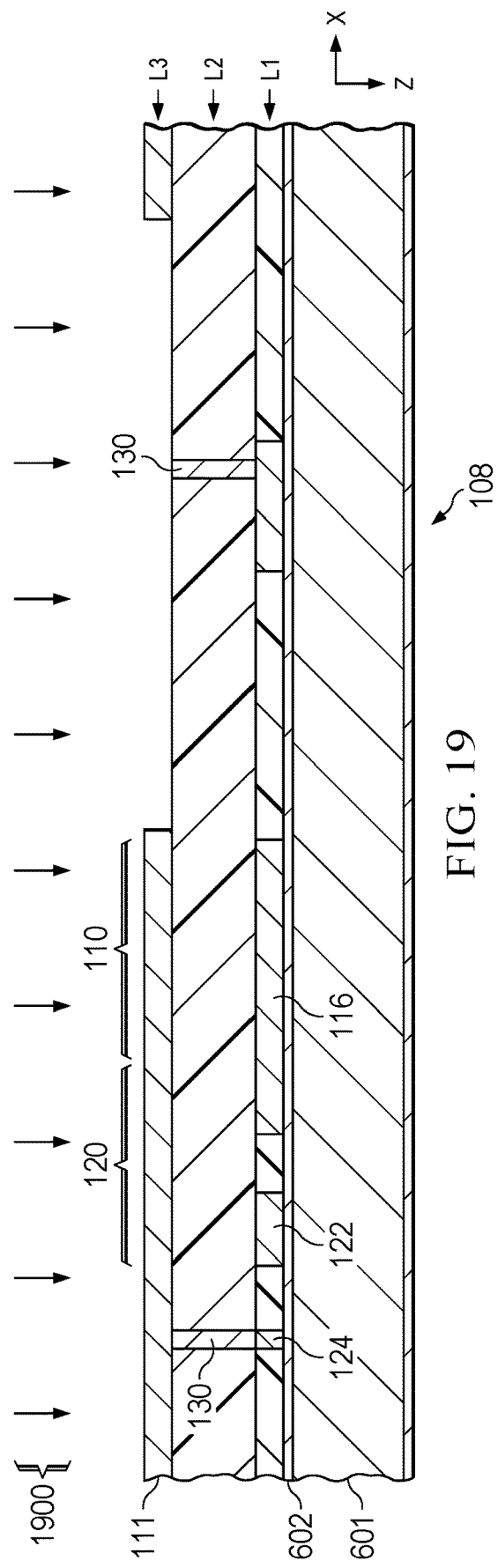

For the illustrated four level example, the third level construction begins at 524 with deposition and patterning of a third plating mask. FIG. 17 shows one example, in which a process 1700 is performed that deposits and patterns a third plating mask 1702 on the top side of the second level L2. The method 500 continues at 526 in FIG. 5 with electroplating copper features of a third trace layer. FIG. 18 shows one example, in which an electroplating process 1800 is performed that deposits copper in the exposed areas of the mask 1702 to form copper features of the third level L3 on the exposed portions of the second level L2. At 528, the third plating mask is removed. FIG. 19 shows one example, in which a process 1900 is performed to remove the third plating mask and leave the plated copper structures of the third level L3.

Figure 20:
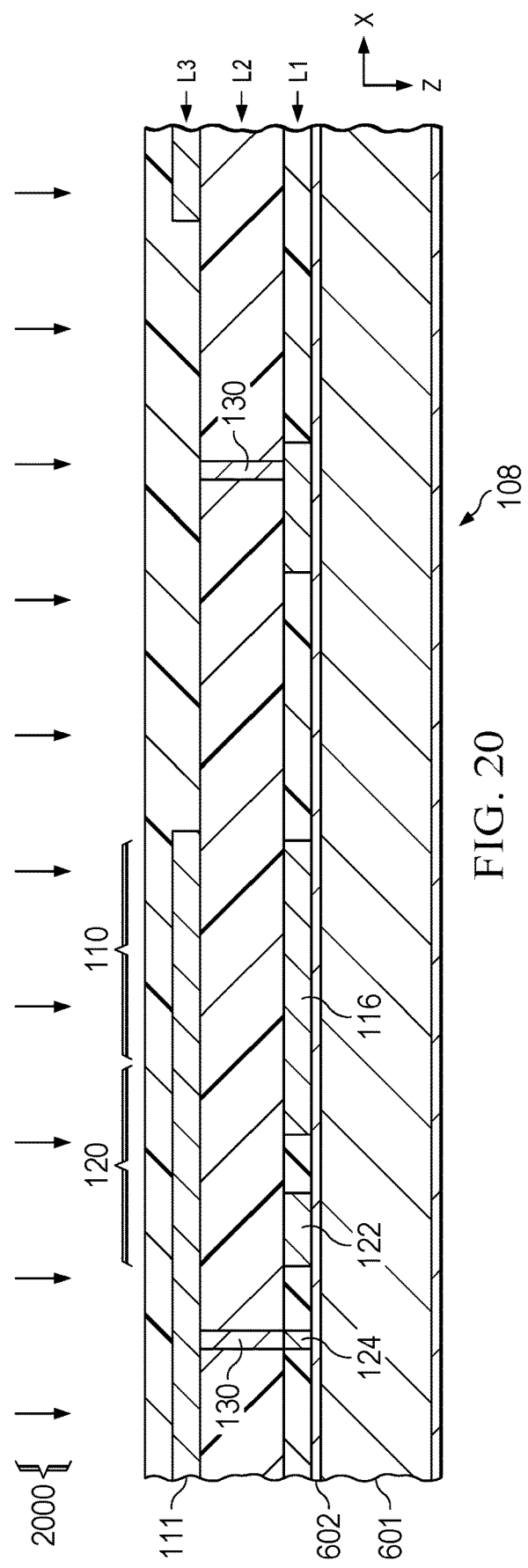
Figure 21:
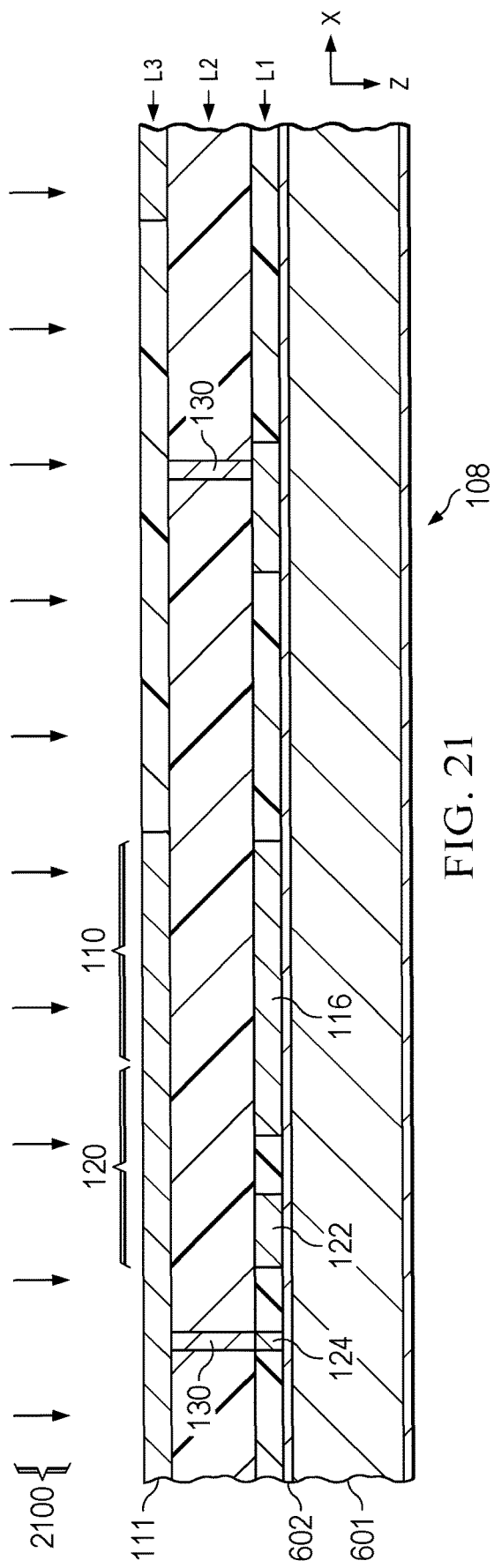

The method 500 continues with compression molding at 530 for the third level. FIG. 20 shows one example, in which a compression molding process 2000 is performed that compression molds a third layer of the dielectric electrically insulating material between and over the patterned conductive features of the third level L3. A grinding operation is performed at 532. FIG. 21 shows one example, in which a grinding process 2100 is performed that grinds and planarizes the top side of the structure. The grinding process 2100 removes an upper portion of the compression molded dielectric electrically insulating material to expose upper portions of the conductive features of the third level L3. The grinding process 2100 is continued to reduce the thickness of the conductive copper and dielectric features of the third level L3 to a final thickness along the third direction Z as shown in FIG. 21.

Figure 5:
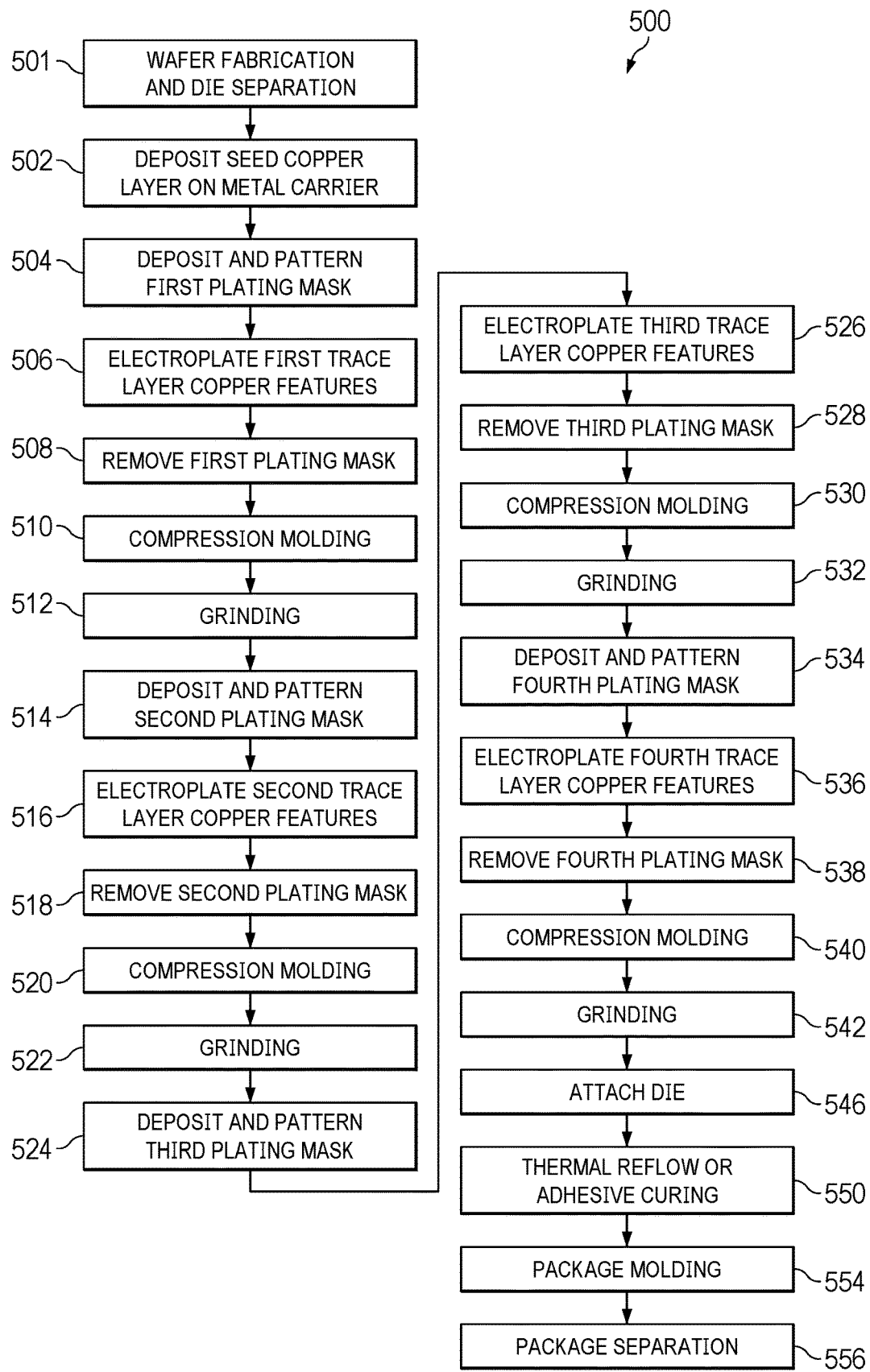
FIG. 5 is a flow diagram of a method of fabricating an electronic device.
Figure 22:
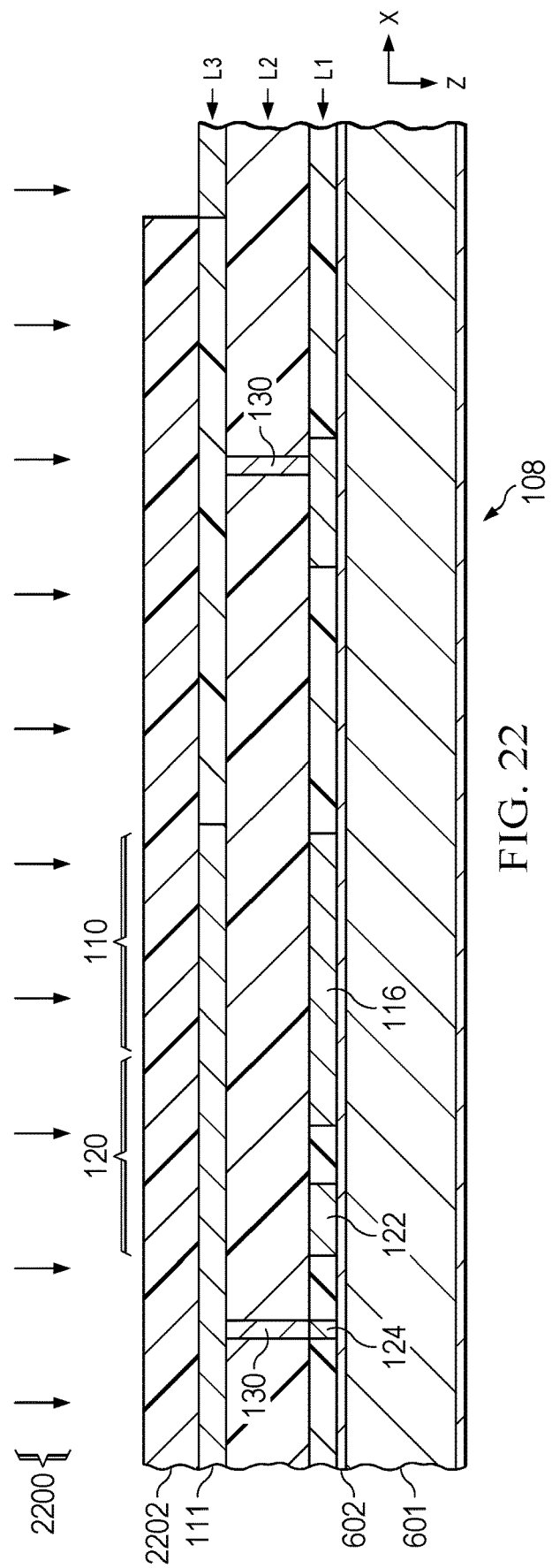
Figure 23:
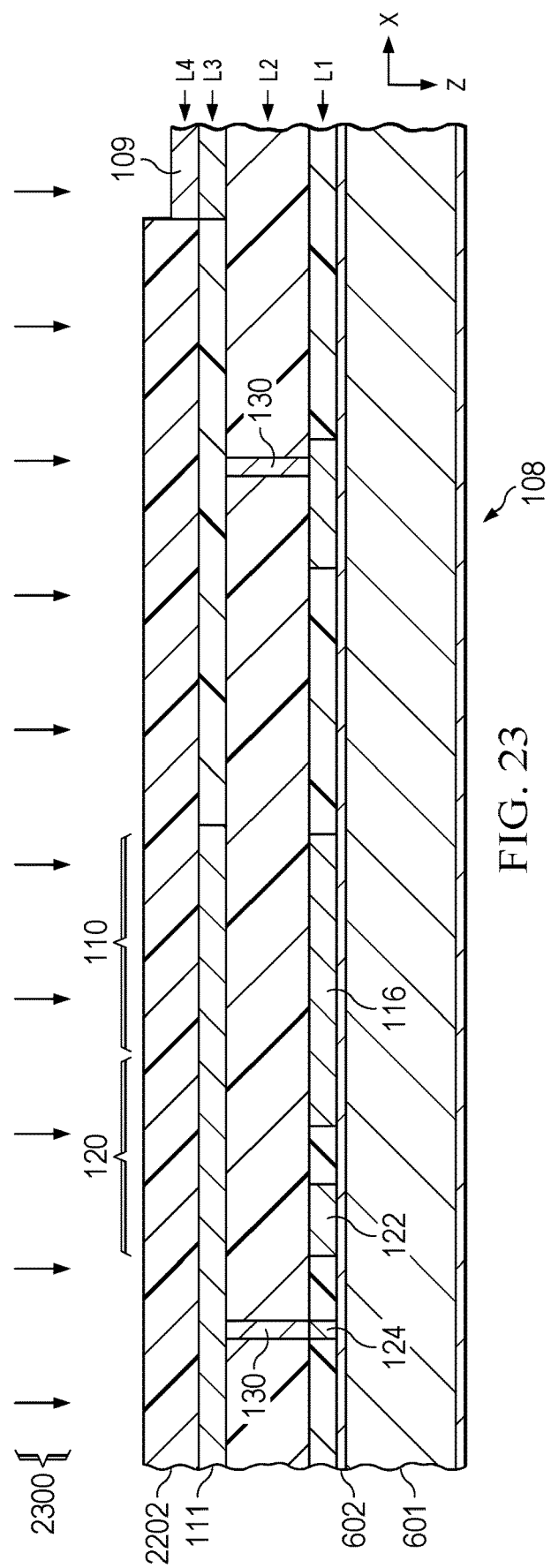
Figure 24:
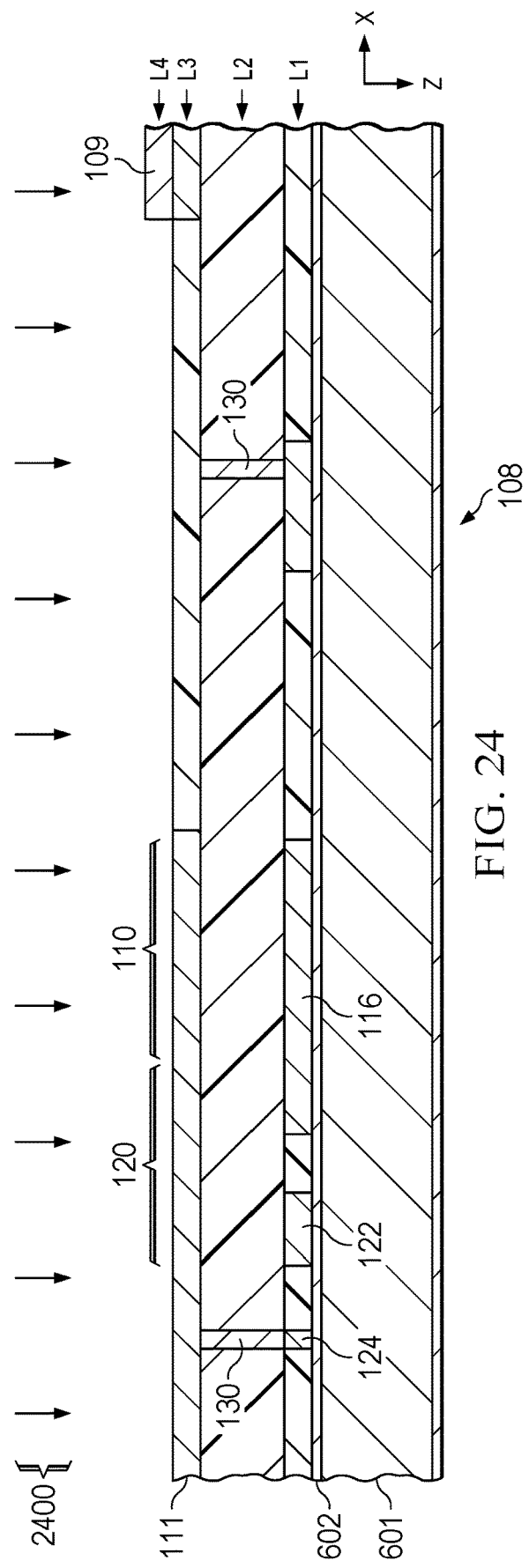
Figure 25:
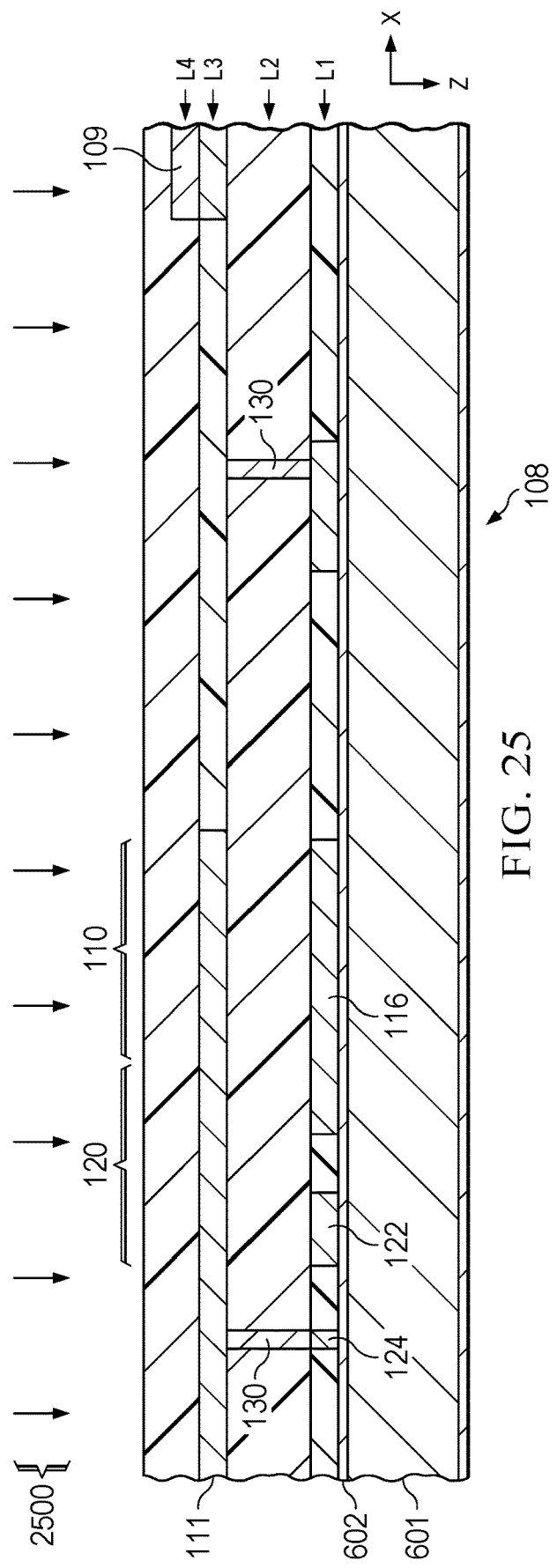
Figure 26:
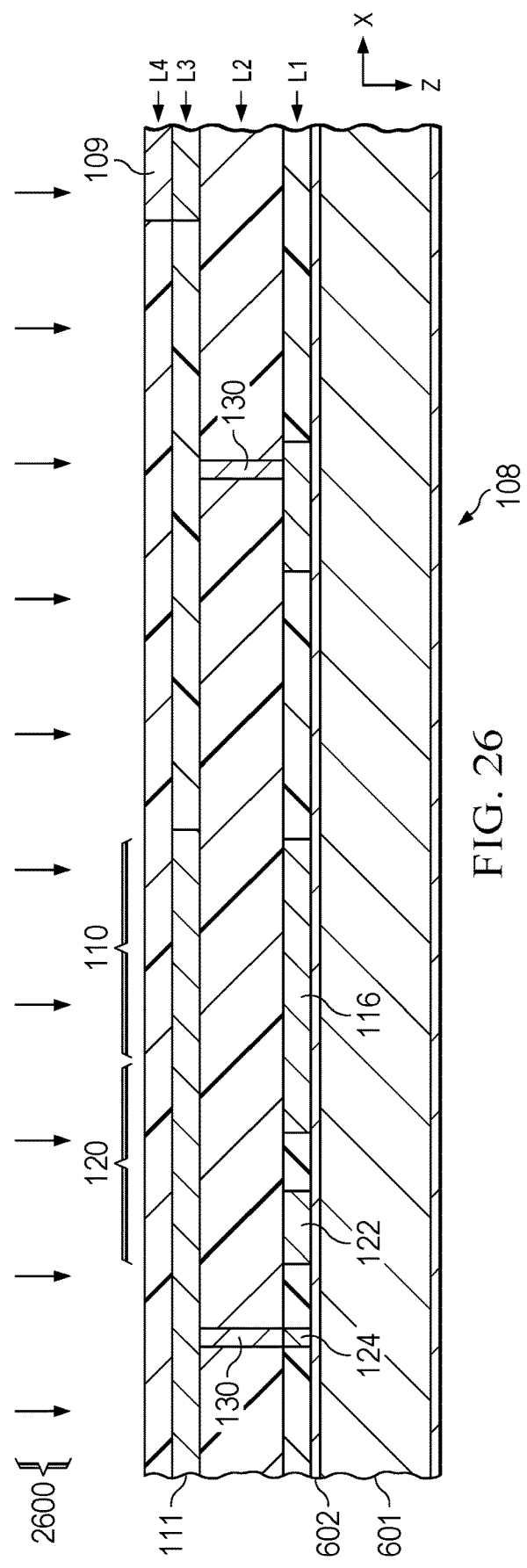

The fourth level construction begins at 534 in FIG. 5 with deposition and patterning of a fourth plating mask. FIG. 22 shows one example, in which a process 2200 is performed that deposits and patterns a fourth plating mask 2202 on the top side of the third level L3. The method 500 continues at 536 in FIG. 5 with electroplating copper features of a fourth trace layer. FIG. 23 shows one example, in which an electroplating process 2300 is performed that deposits copper in the exposed areas of the mask 2202 to form copper features of the fourth level L4 on the exposed portions of the third level L3. At 538, the fourth plating mask is removed. FIG. 24 shows one example, in which a process 2400 is performed to remove the fourth plating mask and leave the plated copper structures of the fourth level L4. The method 500 continues with compression molding at 540 for the fourth level. FIG. 25 shows one example, in which a compression molding process 2500 is performed that compression molds a fourth layer of the dielectric electrically insulating material between and over the patterned conductive features of the fourth level L4. A grinding operation is performed at 542. FIG. 26 shows one example, in which a grinding process 2600 is performed that grinds and planarizes the top side of the structure. The grinding process 2600 removes an upper portion of the compression molded dielectric electrically insulating material to expose upper portions of the conductive features of the fourth level L4. The grinding process 2600 is continued to reduce the thickness of the conductive copper and dielectric features of the fourth level L4 to a final thickness along the fourth direction Z as shown in FIG. 26.

Figure 27:
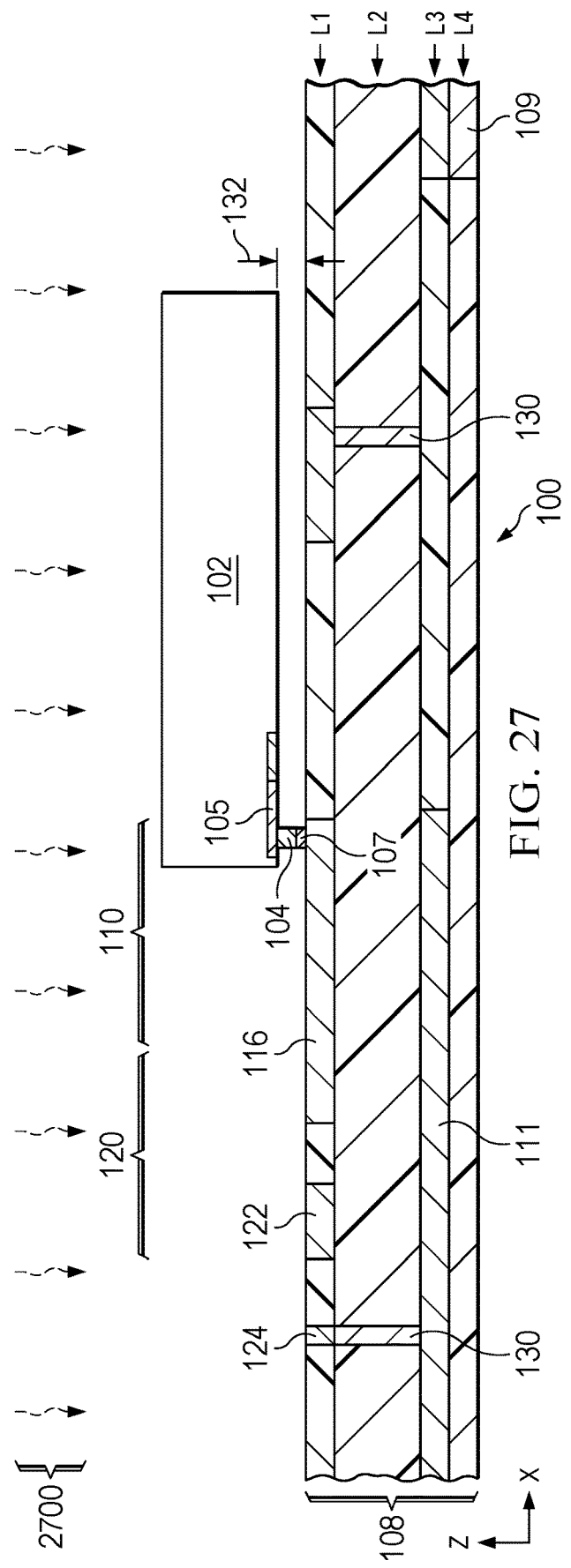
Figure 28:
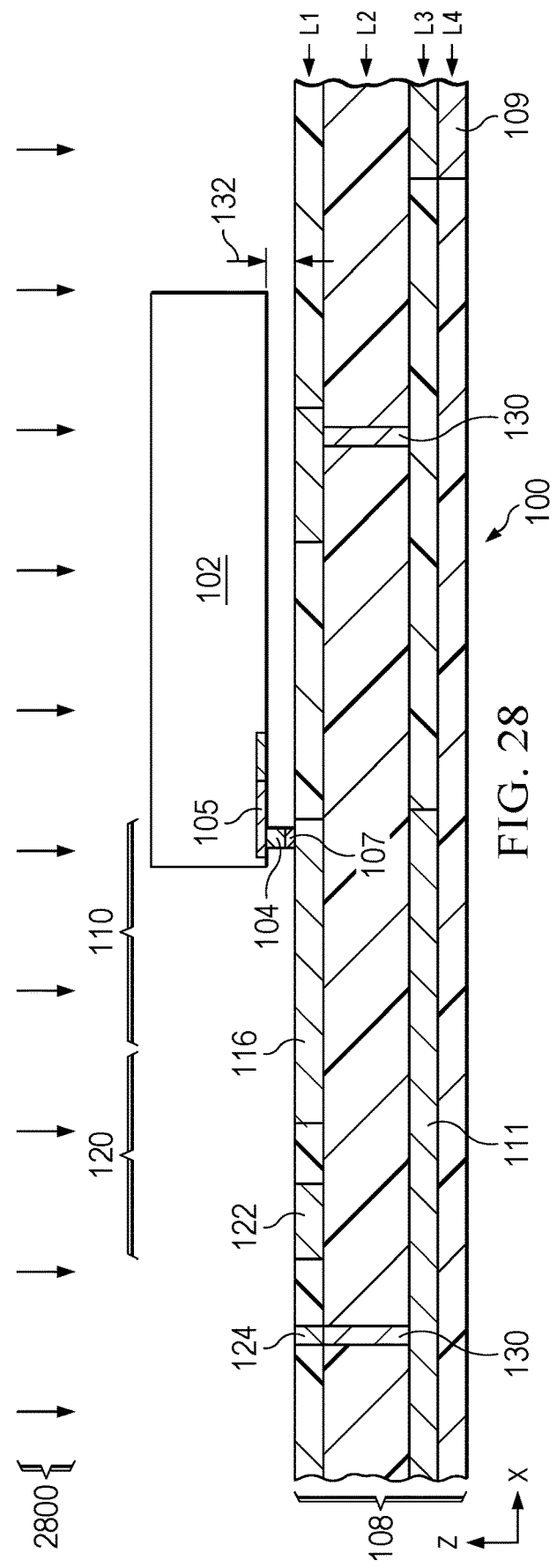
Figure 29:
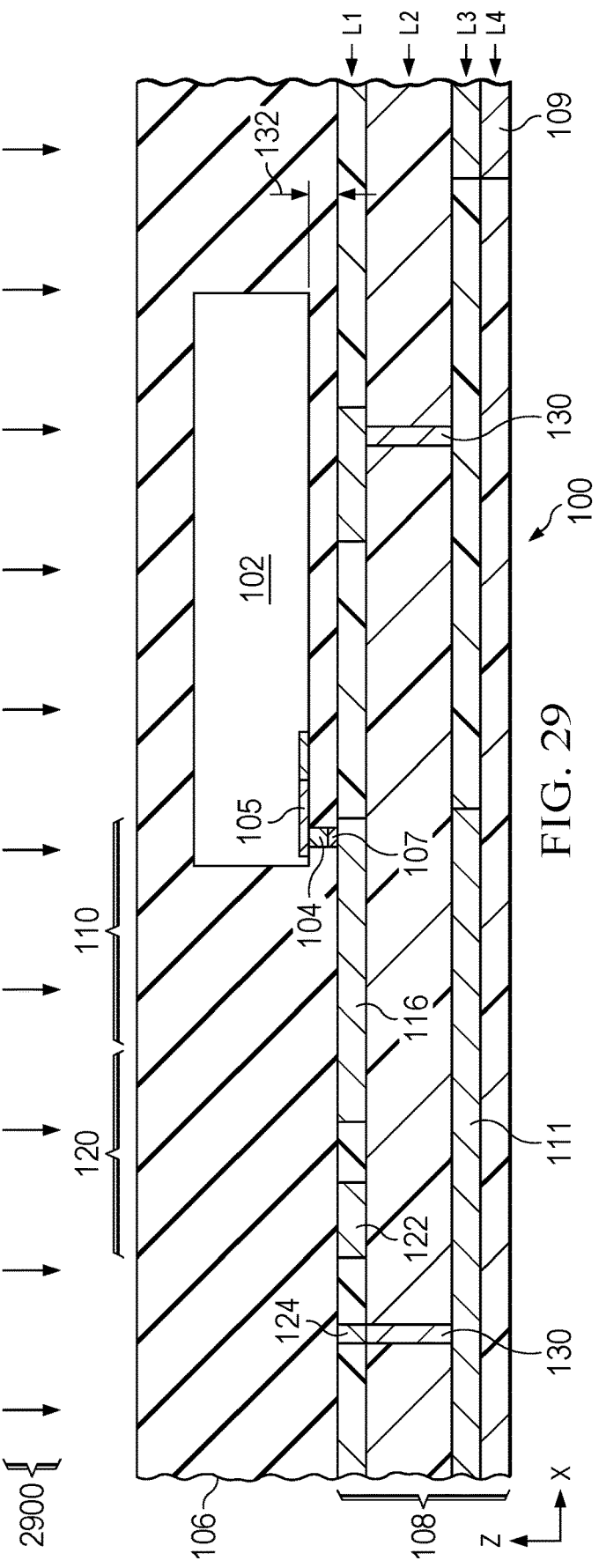
Figure 30:
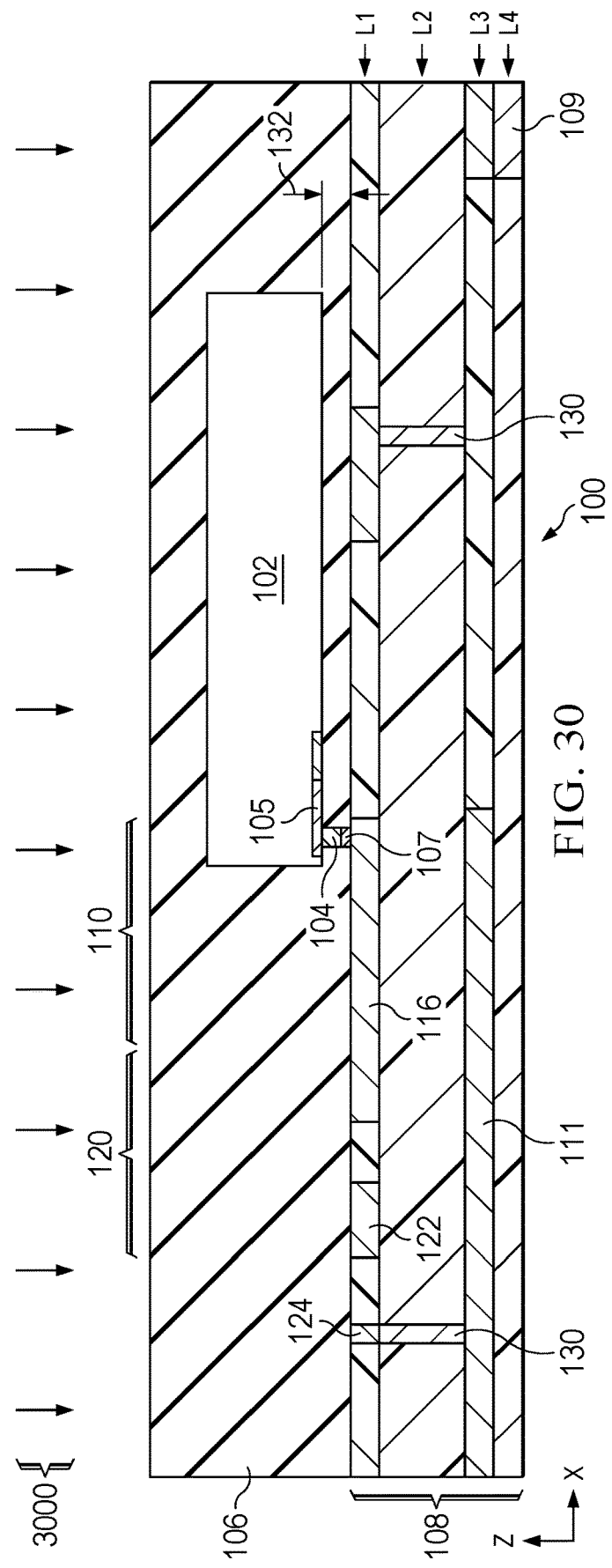

At 546, the semiconductor die 102 is attached to the multilevel packaging substrate 108. FIG. 27 shows one example, in which a flip-chip die attach process 2700 is performed that mounts the semiconductor die 102 on the multilevel packaging substrate 108. The method also includes thermal processing for solder reflow or adhesive curing at 550. FIG. 28 shows one example, in which a thermal process 2800 is performed that reflows the solder 107 to complete the flip-chip mounting of the semiconductor die 102 with the conductive terminals 104 soldered to electrically couple the conductive terminals to respective conductive pads of the first level L1 of the multilevel package substrate 108. The method 500 includes package molding at 554. FIG. 29 shows one example, in which a molding process 2900 is performed that forms the molded package structure 106. The method 500 also includes package separation at 556. FIG. 30 shows one example, in which a saw cutting or laser cutting process 3000 is performed that separates individual finished packaged electronic devices 100 from a concurrently processed panel or array structure. The laser cutting process 3000 forms sides of the conductive leads 109 that are exposed along respective coplanar sides of the packaged electronic device 100.

Figure 31:
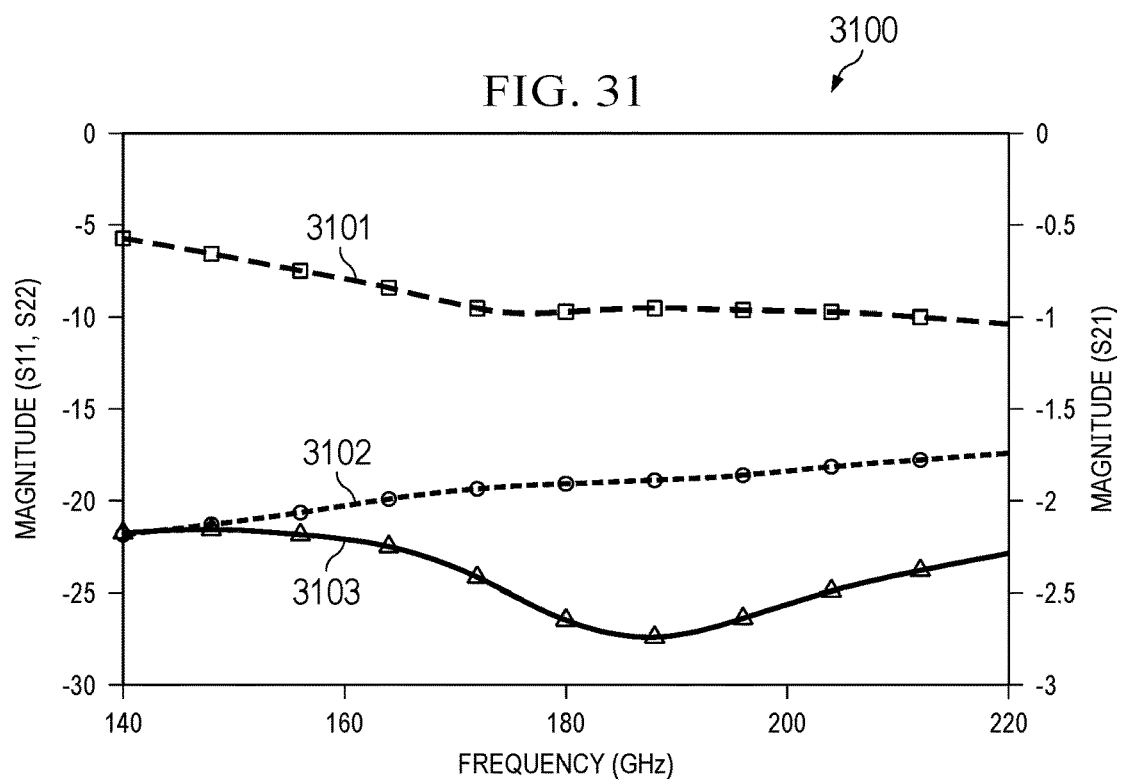
FIG. 31 is a graph of simulated insertion and reflection loss S parameters as a function of frequency in the WR5 band for the chip-to-package transition in the electronic device of FIG. 1.

FIG. 31 shows a graph 3100 with a curve 3101 that illustrates a simulated insertion loss parameter S21 and curves 3102 and 3103 that illustrate simulated reflection loss S parameters S11 and S22 as a function of frequency in the WR5 band of 140 to 220 GHz for the chip-to-package transition in the electronic device 100 of FIG. 1. The simulated results in the graph 300 show a maximum attenuation of approximately 1.04 dB with the return loss being more than 22 dB throughout the frequency range using a quarter-wave transformer to match the 80 Ω impedance of the example simulated antenna 120.

Figure 32:
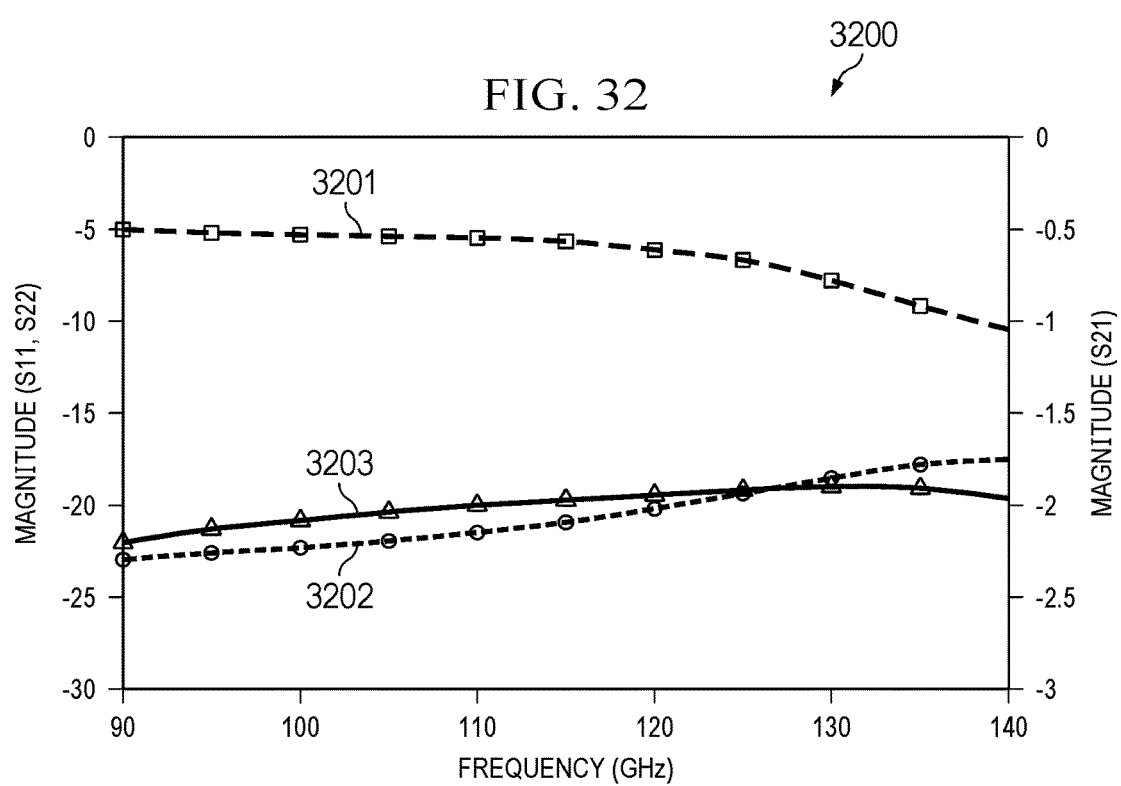
FIG. 32 is a graph of simulated insertion and reflection loss S parameters as a function of frequency in the WR8 band for the chip-to-package transition in the electronic device of FIG. 3.

FIG. 32 shows a graph 3200 with a curve 3201 that illustrates a simulated insertion loss parameter S21 and curves 3202 and 3203 that illustrate simulated reflection loss S parameters S11 and S22 as a function of frequency in the WR8 band of 90 to 140 GHz for the chip-to-package transition in the electronic device 300 of FIG. 3. For the WR8 band, the maximum attenuation loss is approximately 1.07 dB which includes both the chip-to-package transition and the CBCPW of 500 μm length with a return loss of more than 18 dB throughout the band.

The above-described example dimensions of the example electronic devices 100 and 300 provide good results as shown in the simulations of FIGS. 31 and 32, wherein deviation from the described dimensional ranges would result in reduced efficiency demonstrated by reduction in the transmission curve (e.g., curve 3101 in FIG. 31, and increases in the reflection curves 3102 and 3103. The same is true for the WR8 results in FIG. 32, which would be worsened by significant deviation from the above-described dimensional ranges for the electronic device 300 in FIG. 3. The following table includes return loss performance comparison of the integrated SBT antenna 120, 320 in the example flip chip enhanced QF and packages compared with an SBT antenna in an embedded wafer level ball grid array (eWLB) package, and double dipole antenna with parasitic patches in a standard QF and package with a substrate, respectively.

| Antenna Specifications | Integrated SBT in FCeQFN WR8 | Integrated SBT in FCeQFN WR5 | SBT in eWLB | Double Dipole in standard Q FN with substrate |
|---|---|---|---|---|
| −10 dB bandwidth (GHz) | 94-140 | 140-220 | 107-130 | 110-148 |
| Peak Gain (dBi) | 7.1 | 8.45 | 8.0 | 10.9 |
| Peak efficiency | 72 | 83 | 85 | — |

The described example electronic devices 100 and 300 provide improved bandwidth for a −10 dB return loss, which is wider than that of SBT in eWLB and the Double Dipole with substrate. In addition, the described examples provide comparable peak gains and peak efficiency to the other solutions. As shown in the above table, the SBT integration in FCeQFN package provides the best bandwidth over the frequency range of the WR8 and WR5 bands.

Figure 33:
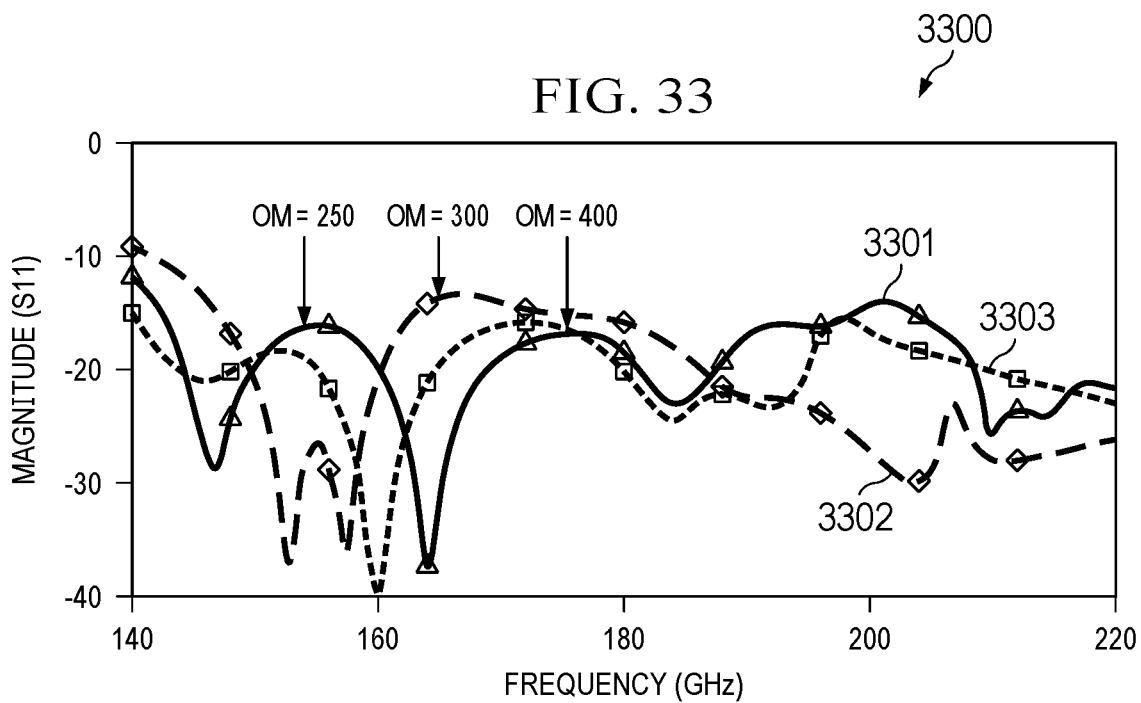
FIG. 33 is a graph of simulated return loss performance as a function of frequency in the WR5 band for different over-molding values in the electronic device of FIG. 1.
Figure 34:
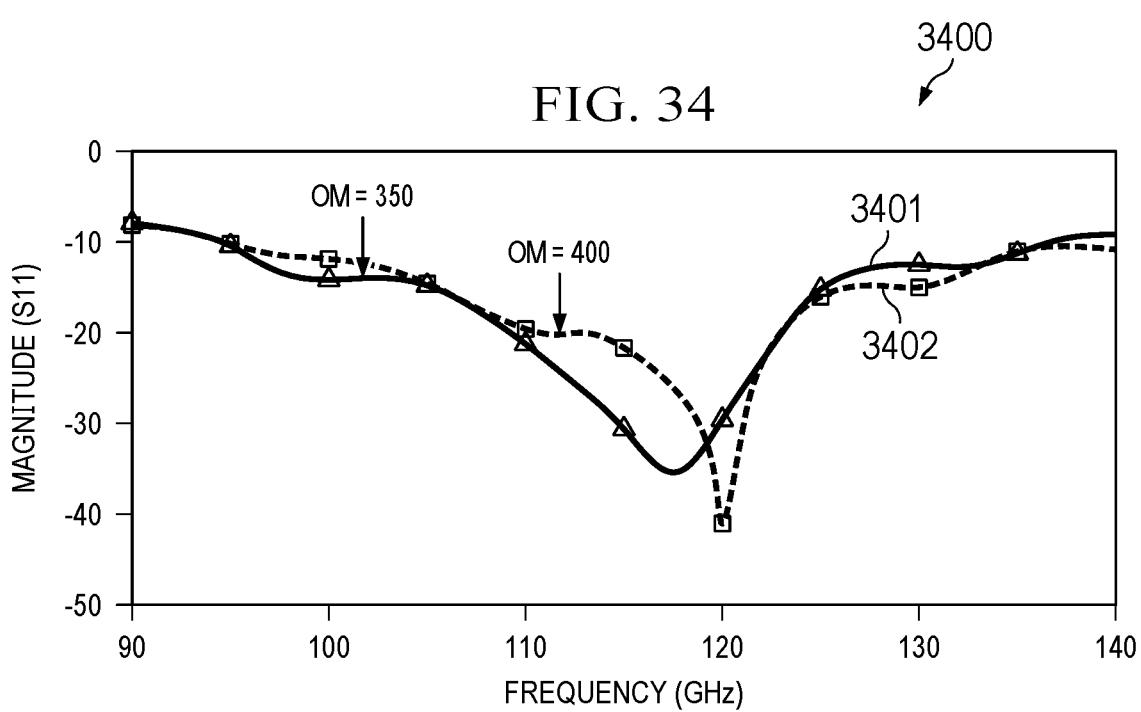
FIG. 34 is a graph of simulated return loss performance as a function of frequency in the WR8 band for different over-molding values in the electronic device of FIG. 3.

FIGS. 33 and 34 illustrate further simulated results showing return loss characteristics for the integrated SBT antennas of the respective electronic devices 100 and 300 in addition to the effect of manufacturing tolerances of the over-mold (OM). This shows the antennas wide band performance across the targeted frequencies of the respective WR5 and WR8 bands. FIG. 33 shows a graph 3300 of simulated return loss (e.g., S11) performance as a function of frequency in the WR5 band with a curve 3301 showing the performance for an over-molding value of 250, a curve 3302 showing the performance for an over-molding value of 300, and a curve 3303 showing the performance for an over-molding value of 400 for the electronic device 100 of FIG. 1 above. FIG. 34 shows a graph 3400 of simulated return loss (e.g., S11) performance as a function of frequency in the WR8 band with a curve 3401 showing the performance for an over-molding value of 350, as well as a curve 3402 showing the performance for an over-molding value of 400 for the electronic device 300 of FIG. 3.

Figure 36:
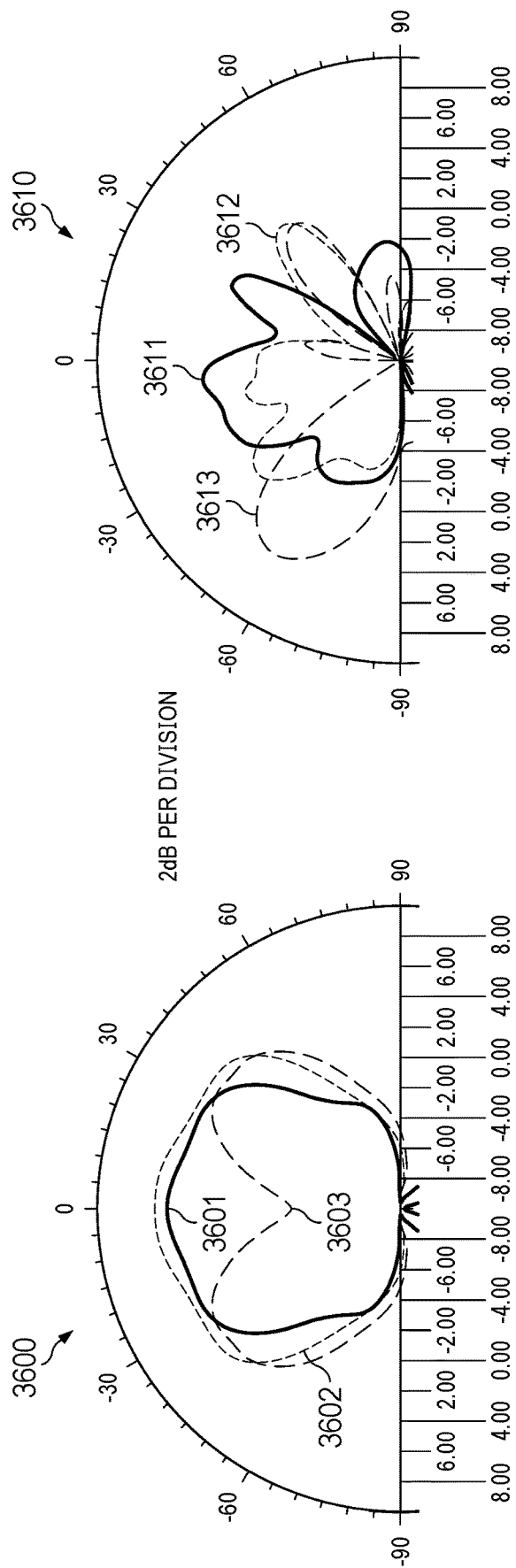
FIG. 36 shows spherical coordinate system radiation graphs at two different angles for the electronic device of FIG. 3.

FIGS. 35 and 36 illustrate example radiation patterns at two different angles of a spherical coordinate system for the integrated SBT electronic devices 100 and 300 in the respective WR5 and WR8 bands. A graph 3500 in FIG. 35 shows a radiation pattern graph for an angle Phi =0 degrees of the electronic device 100 in the WR5 band (e.g., 140 to 220 GHz) including a curve 3501 of realized gain at 180 GHz, a curve 3502 of realized gain at 190 GHz, a curve 3503 of realized gain at 200 GHz, and a curve 3504 of realized gain at 210 GHz. A second graph 3510 in FIG. 35 shows a radiation pattern graph of the electronic device 100 for an angle Phi=90 degrees in the WR5 band (e.g., 140 to 220 GHz) including a curve 3511 of realized gain at 180 GHz, a curve 3512 of realized gain at 190 GHz, a curve 3513 of realized gain at 200 GHz, and a curve 3514 of realized gain at 210 GHz.

In FIG. 36, a graph 3600 shows a radiation pattern graph for an angle Phi=0 degrees of the electronic device 300 in the WR8 band (e.g., 90 to 140 GHz) including a curve 3601 of realized gain at 90 GHz, a curve 3602 of realized gain at 110 GHz, and a curve 3603 of realized gain at 120 GHz. A second graph 3610 in FIG. 36 shows a radiation pattern graph for an angle Phi=90 degrees of the electronic device 300 in the WR8 band including a curve 3611 of realized gain at 90 GHz, a curve 3612 of realized gain at 110 GHz, and a curve 3613 of realized gain at 120 GHz.

The described electronic devices 100 and 300 and the associated transitions and interconnect structures provide performance improvements and cost benefits compared to other integrated antenna solutions. The described FCeQFN examples have lower cost compared to different packaging options such as low temperature co-fired ceramic (LTCC), ball grid array (BGA) and through silicon via (TSV) packaging options. In addition, the transmission line performance is improved compared to lead frame based QF and package technologies.

Modifications are possible in the described examples, and other implementations are possible, within the scope of the claims.

What is claimed is:

1. An electronic device, comprising:
   a multilevel package substrate having a first level, a second level, a third level, and a fourth level, the first, second, third, and fourth levels each including a respective dielectric layer and respective patterned conductive features, the first, second, third, and fourth levels extending in respective first, second, third, and fourth planes of a first direction and an orthogonal second direction, the second level between the first and third levels along a third direction that is orthogonal to the first and second directions, and the third level between the second and fourth levels along the third direction;
   conductive leads in the fourth level of the multilevel package substrate;
   a semiconductor die mounted to the first level of the multilevel package substrate and having conductive pads and conductive terminals coupled to respective ones of the conductive pads;
   a package structure that encloses the semiconductor die and a portion of the multilevel package substrate; and
   a conductor backed coplanar waveguide transmission line feed, including an interconnect and a conductor, the interconnect including coplanar first, second, and third conductive lines extending in the first level along the first direction from respective ends to an antenna, the second and third conductive lines spaced apart from opposite sides of the first conductive line along the second direction, the ends of the first, second, and third conductive lines coupled to respective ones of the conductive terminals of the semiconductor die, and the conductor extending in the third level of the multilevel package substrate under the interconnect and under the antenna.

2. The electronic device of claim 1, further comprising a conductive wall extending around the antenna in the first, second, and third levels.

3. The electronic device of claim 2, wherein the conductive wall is connected to the second and third conductive lines of the interconnect.

4. The electronic device of claim 2, wherein:
   the first, second, and third conductive lines have lengths along the first direction of 400 μm or more and 600 μm or less;
   the first conductive line has a width along the second direction of 32 μm or more and 48 μm or less;
   the second and third conductive lines are spaced apart from the respective opposite sides of the first conductive line along the second direction by a spacing distance of 21.6 μm or more and 32.4 μm or less; and
   the conductive terminals have a diameter in a plane of the first and second directions of 24 μm or more and 36 μm or less.

5. The electronic device of claim 1, wherein:
   the first, second, and third conductive lines have lengths along the first direction of 400 μm or more and 600 μm or less;
   the first conductive line has a width along the second direction of 32 μm or more and 48 μm or less;
   the second and third conductive lines are spaced apart from the respective opposite sides of the first conductive line along the second direction by a spacing distance of 21.6 μm or more and 32.4 μm or less; and
   the conductive terminals have a diameter in a plane of the first and second directions of 24 μm or more and 36 μm or less.

6. The electronic device of claim 5, wherein:
   the conductive pads have a length along the first direction of 64 μm or more and 96 μm or less;
   the conductive pads have a width along the second direction of 32 μm or more and 48 μm or less; and
   centers of the conductive pads are spaced apart from one another along the second direction by a pitch distance of 48 μm or more and 72 μm or less.

7. The electronic device of claim 1, wherein:
   the conductive pads have a length along the first direction of 64 μm or more and 96 μm or less;
   the conductive pads have a width along the second direction of 32 μm or more and 48 μm or less; and
   centers of the conductive pads are spaced apart from one another along the second direction by a pitch distance of 48 μm or more and 72 μm or less.

8. The electronic device of claim 1, wherein:
   the first, second, and third conductive lines have lengths along the first direction of 400 μm or more and 600 μm or less;
   the first conductive line has a width along the second direction of 48 μm or more and 72 μm or less;
   the second and third conductive lines are spaced apart from the respective opposite sides of the first conductive line along the second direction by a spacing distance of 27.2 μm or more and 40.8 μm or less; and
   the conductive terminals have a diameter in a plane of the first and second directions of 28 μm or more and 42 μm or less.

9. The electronic device of claim 8, wherein:
the conductive pads have a length along the first direction of 80 μm or more and 120 μm or less;
the conductive pads have a width along the second direction of 48 μm or more and 72 μm or less; and
centers of the conductive pads are spaced apart from one another along the second direction by a pitch distance of 76 μm or more and 114 μm or less.

10. The electronic device of claim 1, wherein:
the conductive pads have a length along the first direction of 80 μm or more and 120 μm or less;
the conductive pads have a width along the second direction of 48 μm or more and 72 μm or less; and
centers of the conductive pads are spaced apart from one another along the second direction by a pitch distance of 76 μm or more and 114 μm or less.

11. A multilevel package substrate, comprising:
a first level having a first dielectric layer and first patterned conductive features in a first plane of a first direction and an orthogonal second direction;
a second level having a second dielectric layer and second patterned conductive features in a second plane of the first and second directions;
a third level having a third dielectric layer and third patterned conductive features in a third plane of the first and second directions, the second level between the first and third levels along a third direction that is orthogonal to the first and second directions;
a fourth level having a fourth dielectric layer and fourth patterned conductive features in a fourth plane of the first and second directions, the third level between the second and fourth levels along the third direction; and
a conductor backed coplanar waveguide transmission line feed, including an interconnect and a conductor, the interconnect including coplanar first, second, and third conductive lines extending in the first level along the first direction from respective ends to an antenna, the second and third conductive lines spaced apart from opposite sides of the first conductive line along the second direction, and the conductor extending in the third level of the multilevel package substrate under the interconnect and under the antenna.

12. The multilevel package substrate of claim 11, further comprising a conductive wall extending around the antenna in the first, second, and third levels.

13. The multilevel package substrate of claim 12, wherein the conductive wall is connected to the second and third conductive lines of the interconnect.

14. The multilevel package substrate of claim 12, wherein:
the first, second, and third conductive lines have lengths along the first direction of 400 μm or more and 600 μm or less;
the first conductive line has a width along the second direction of 32 μm or more and 48 μm or less; and
the second and third conductive lines are spaced apart from the respective opposite sides of the first conductive line along the second direction by a spacing distance of 21.6 μm or more and 32.4 μm or less.

15. The multilevel package substrate of claim 11, wherein:
the first, second, and third conductive lines have lengths along the first direction of 400 μm or more and 600 μm or less;
the first conductive line has a width along the second direction of 32 μm or more and 48 μm or less; and
the second and third conductive lines are spaced apart from the respective opposite sides of the first conductive line along the second direction by a spacing distance of 21.6 μm or more and 32.4 μm or less.

16. The multilevel package substrate of claim 11, wherein:
the first, second, and third conductive lines have lengths along the first direction of 400 μm or more and 600 μm or less;
the first conductive line has a width along the second direction of 48 μm or more and 72 μm or less;
the second and third conductive lines are spaced apart from the respective opposite sides of the first conductive line along the second direction by a spacing distance of 27.2 μm or more and 40.8 μm or less; and
the conductive terminals have a diameter in a plane of the first and second directions of 28 μm or more and 42 μm or less.

* * * * *